US009268896B1

(12) United States Patent
Tang et al.

(10) Patent No.: US 9,268,896 B1
(45) Date of Patent: Feb. 23, 2016

(54) METHOD OF FORMING A PHOTOMASK

(71) Applicant: UNITED MICROELECTRONICS CORP., Hsin-Chu (TW)

(72) Inventors: Chih-Hsien Tang, Taipei (TW);
Shih-Hung Tsai, Tainan (TW);
Chun-Hsien Huang, Tainan (TW);
Yao-Jen Fan, Chiayi (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/576,212

(22) Filed: Dec. 19, 2014

(51) Int. Cl.
*G06F 17/50* (2006.01)
(52) U.S. Cl.
CPC .................. *G06F 17/5072* (2013.01)
(58) Field of Classification Search
None
See application file for complete search history.

(56) References Cited

U.S. PATENT DOCUMENTS

| 5,795,830 | A | 8/1998 | Cronin |
| 6,063,688 | A | 5/2000 | Doyle et al. |
| 8,669,186 | B2 | 3/2014 | Licausi |
| 8,782,575 | B1 * | 7/2014 | Hsu ............... G06F 17/5081 716/112 |

* cited by examiner

*Primary Examiner* — Yasser A Abdelaziez
(74) *Attorney, Agent, or Firm* — Winston Hsu; Scott Margo

(57) ABSTRACT

A method of forming a photomask comprises providing a predetermined fin array having a plurality of fin patterns to a computer readable medium in a computer system. First of all, a plurality of width markers is defined by using the computer system, with each of the width marker parallel to each other and comprising two fin patterns, wherein each of the width markers is spaced from each other by a space. Then, a number of the width markers is checked to be an even. Following this, a plurality of pre-mandrel patterns is defined corresponding to odd numbered ones of the spaces. Then, a plurality of mandrel patterns is defined by sizing up the pre-mandrel patterns. Finally, the mandrel patterns are outputted to form a photomask.

20 Claims, 23 Drawing Sheets

METHOD OF FORMING A PHOTOMASK

BACKGROUND OF THE INVENTION

1. Field of the Invention

The present invention relates to a method of forming a photomask, and more particularly to a method of forming a photomask based on a decomposition algorithm of a fin array.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (FinFET) have three-dimensional structure, not only capable of increasing the contact to the gate but also improving the controlling of the channel region, such that the non-planar FETs have replaced the planar FETs and become the mainstream of the development.

In current techniques, in order to meet the sub-lithographic requirements, a regular photolithography and an etching process are provided to form fin structures in the FinFET. Additionally, the fabrication of semiconductor device also utilizes a pattern transfer technique, such as the sidewall image transfer (SIT) process, to form required fin structures. However, although being beneficial to fabricate the fin structures in finer critical dimension (CD), the pattern transfer technique also complicates the fabrication process of FinFET. Furthermore, the current fabrication process also faces more limitations, such as fin collapse and malposition issues, so that the current fabrication process still not fully meet the demand of the product, and requires further improvement.

SUMMARY OF THE INVENTION

It is one of the primary objectives of the present invention to provide a method for solving the aforementioned issues, in which, a photomask having customized mandrel layout can be easily and conveniently formed, so as to form a fin-shaped structure through a more efficient strategy.

To achieve the purpose described above, the present invention provides a method of forming a photomask, comprising providing a predetermined fin array having a plurality of fin patterns to a computer readable medium in a computer system. First of all, a plurality of width markers is defined by using the computer system, with each of the width markers parallel to each other and comprising two fin patterns, wherein each of the width markers is spaced from each other by a space. Then, a number of the width markers is checked to be an even. Following this, a plurality of pre-mandrel patterns is defined corresponding to odd numbered ones of the spaces. Then, a plurality of mandrel patterns is defined by sizing up the pre-mandrel patterns. Finally, the mandrel patterns are outputted to form a photomask.

To achieve the purpose described above, the present invention provides another method of forming a photomask, comprising providing a predetermined fin array having a plurality of fin patterns to a computer readable medium in a computer system. First of all, a plurality of width markers is defined by using the computer system, with each of the width marker parallel to each other and comprising two fin patterns, wherein each of the width markers is spaced from each other by a space. Then, a number of the width markers is checked to be an even. Following this, a plurality of mandrel patterns is defined corresponding to odd numbered ones of the spaces. Finally, the mandrel patterns are outputted to form a photomask.

The present invention is to print predetermined mandrel patterns from Lithography, and applied to the fabrication process of the FinFET, for example a double SIT process or a single SIT process. Through the method of forming a photomask of the present invention, the width marker of a fixed width is firstly defined, and then the fin widths, as well as the space between fins are easy to be adjusted according to the practical requirement, so as to obtain a photomask having adjustable mandrel array layout, for example having mandrels of adjustable width and spaces of adjustable width between mandrels sufficiently. Accordingly, the present invention is to print predetermined mandrel patterns from Lithography, and applied to the fabrication process of the FinFET, for example a double SIT process or a single SIT process, to form various fin array layout.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
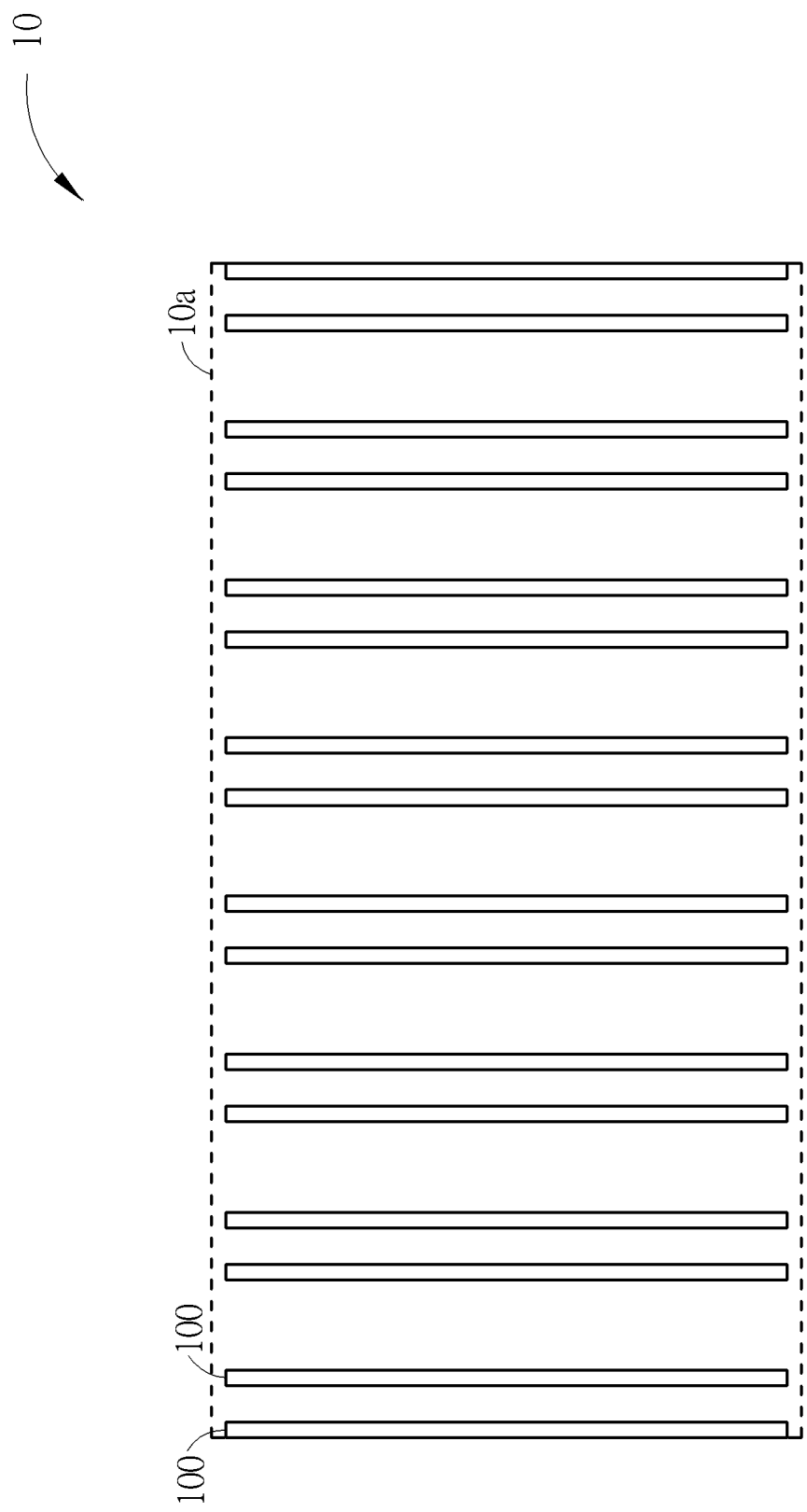
FIG. 1 to FIG. 4 are schematic diagrams illustrating various states in a method of forming a photomask according to a first preferred embodiment of the present invention.
Figure 21:
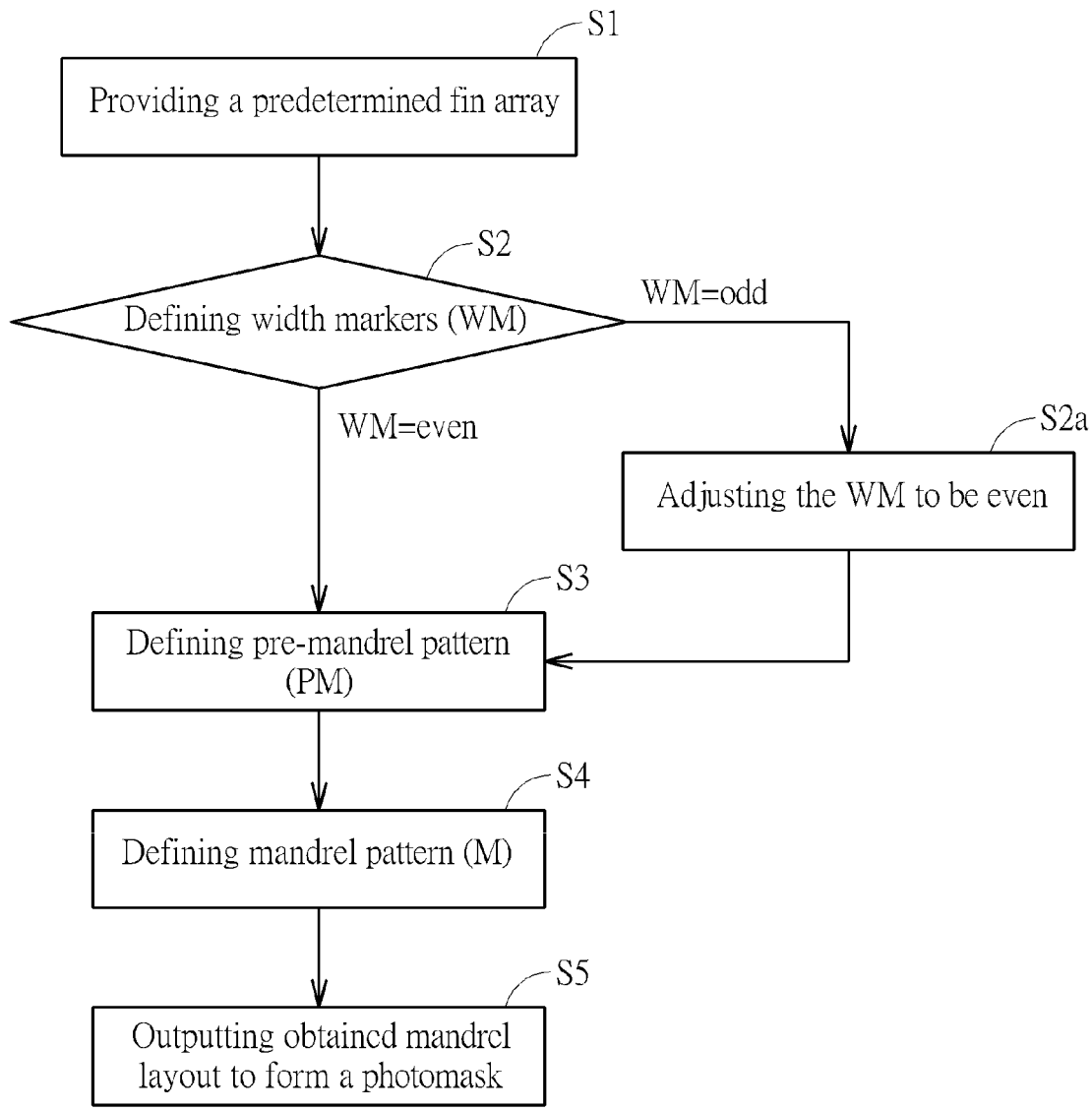
FIG. 21 is a flow chart illustrating a method of forming a photomask according to the first preferred embodiment of the present invention.

The present invention is related to a method of forming a photomask, in which a computer system is provided to execute following steps. Firstly, referring to FIG. 21, FIG. 21 is a flowchart illustrating a method of forming the photomask according to a first preferred embodiment of the present invention. As shown in FIG. 1, a predetermined fin array 10 is provided to a computer readable medium in the computer system (not shown in the drawings) (step S1), wherein the predetermined fin array 10 including a plurality of fin patterns 100. Preferably, a regular region 10a of the predetermined fin array 10 is selected, wherein, the regular region 10a refers to a region having the fin patterns 100 arranged regularly, for example being spaced from each other in spaces arranged alternately as shown in FIG. 1 or in a same space, but not limited thereto. It is worth mentioning that since a regularly arranged fin array formed through a double sidewall image transferring (dSIT) process is exemplified as the fin array 10 of the present embodiment, the whole of the fin array 10 is selected as the regular region 10a. In one embodiment, there is a pitch being between 10 nm and 60 nm between any two adjacent fin patterns 100 in the regular region 10a, but not limited thereto. People in the arts shall be easy to realize that the numbers, the size and the fin arrangement shown in FIG. 1 are only for exemplifying the regular region, those in the art shall be easily to realize that the present invention is not limited thereto.

Figure 2:
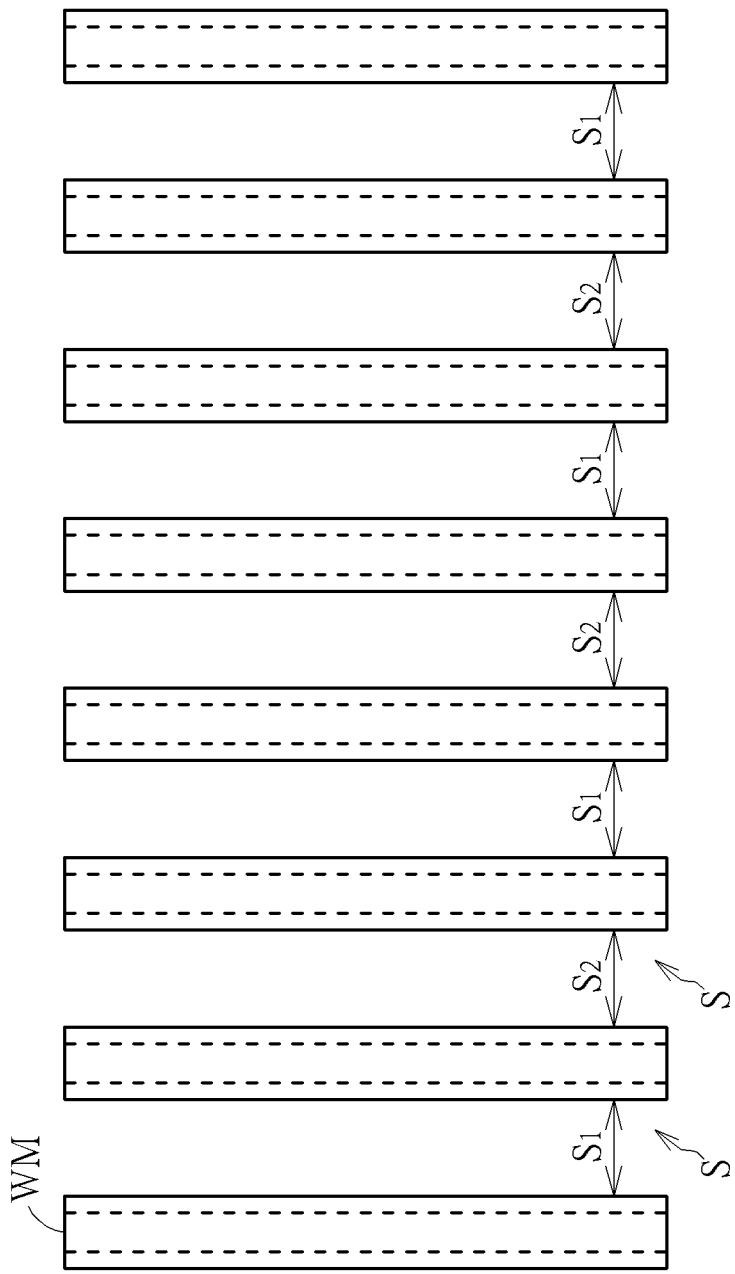

Next, as shown in FIGS. 2 and 21, a plurality of width marker WM are defined (step S2) from left to right based on the fin patterns 100 in the regular region 10a of the predetermined fin array 10 shown in FIG. 1. Precisely, each of the width markers WM in the present embodiment includes two fin patterns 100 and has a width substantially greater than two times of fin pattern width, for example, if each fin pattern 100 has a width of x, the width of each width marker WM may be greater than 2x. However, in another embodiment, each of the width markers may also include only one fin pattern or more than two fin patterns, namely, such width marker may substantially cover at least one fin pattern according to the practical requirements. In addition, each of the width markers WM is parallel to each other and spaced from each other by a space S. Preferably, the step of defining the width marker (WM) further includes checking a number of the width marker (WM), in which the number of the width markers WM may be checked to be an even, which also means the number of the space S may be an odd. In another embodiment, if the number of the width markers WM may be an odd (also known as the number of the space S being an even), and then, an additional adjusting step (step S2a) has to be performed additionally by adding one additional width marker WM to adjust the number of the width marker WM from the odd to the even (also known as adjusting the number of the space S from the even to the odd), as shown in FIG. 21.

It is also worth of mentioning that, as shown in FIG. 2, the spaces S can be divided into a plural spaces $S_1$, which are odd numbered space (from left to right) and a plural spaces $S_2$, which are even numbered space (from left to right), wherein the spaces $S_1$ and the spaces $S_2$ are preferably greater than a critical dimension (CD) and between a maximum and a minimum respectively. Please note that, the critical dimension of the present embodiment refers to an after-develop-inspection critical dimension (ADI CD) and after-etch-inspection critical dimension (AEI CD) for remedying indistinguishable two width markers WM. In other words, the CD may vary from elements and various fabrication processes, for example, the CD for 20 nm NAND flash is 40 nm and the CD for 20 nm gate is 20 nm.

Figure 3:
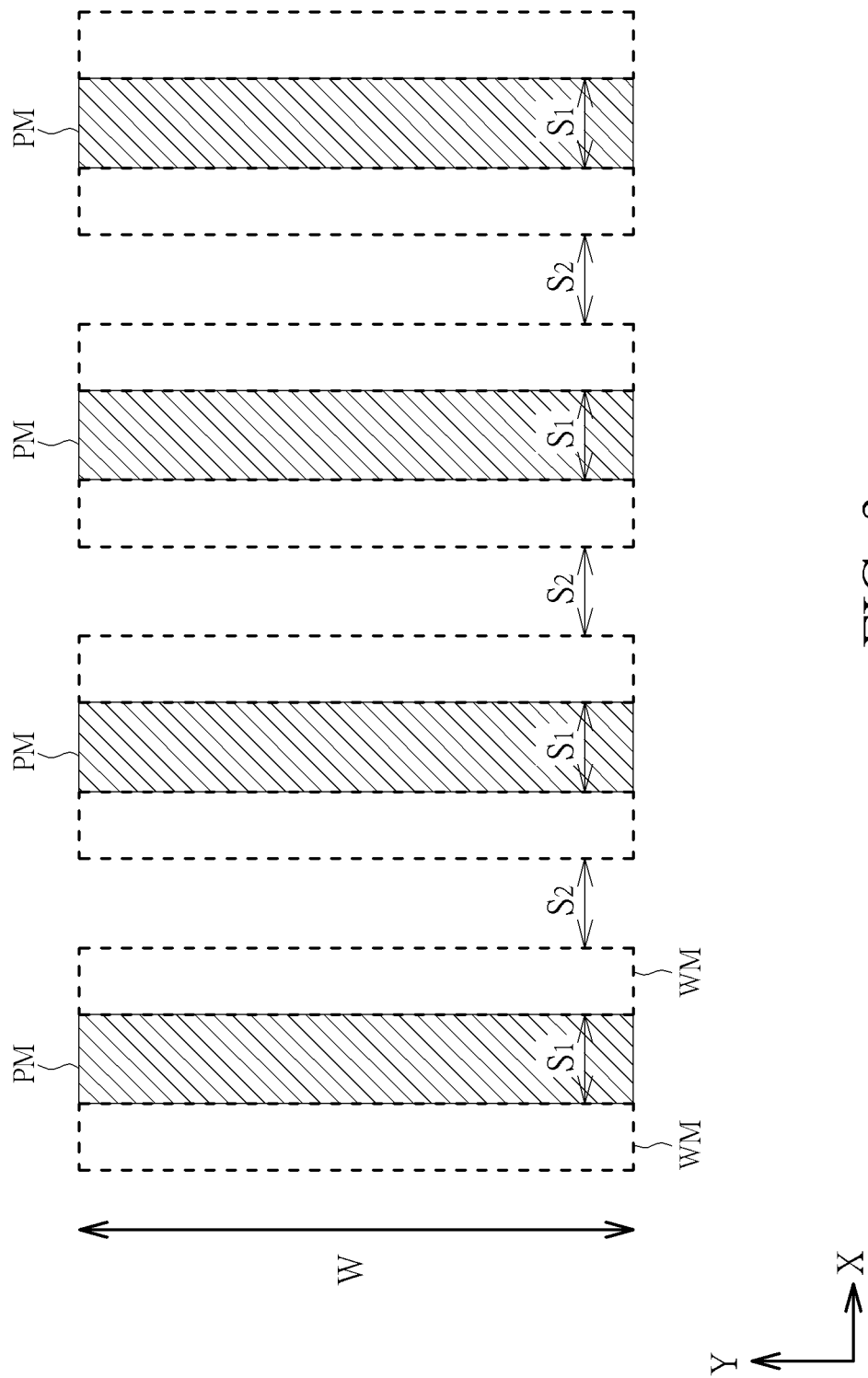

Following this, as shown in FIGS. 3 and 21, a plurality of pre-mandrel patterns PM is defined firstly by coloring such odd numbered spaces S (namely $S_1$) between the width markers WM from left to right (step S3). Precisely speaking, each of the pre-mandrel patterns PM is defined according to the odd numbered spaces S, such that each of the pre-mandrel patterns PM may be parallel to each other and spaced from each other by the even number spaces S (namely $S_2$) and the width markers WM.

Figure 4:
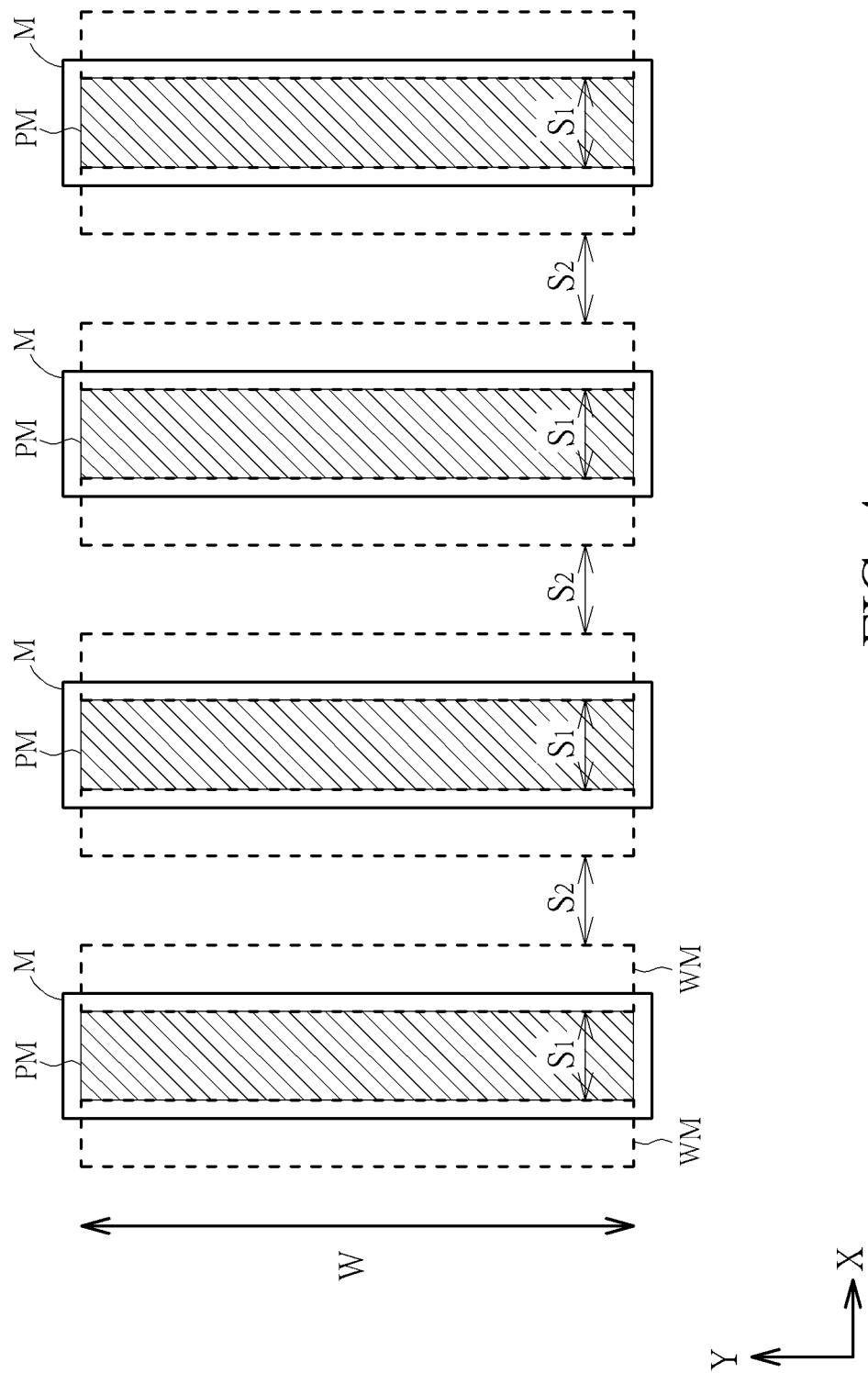

Then, as shown in FIGS. 4 and 21, those pre-mandrel patterns PM are then sized up to define a plurality of mandrel patterns M (step S4). Please note that, each of the pre-mandrel patterns PM are sized up both in a first direction Y which is parallel to the pre-mandrel patterns PM and a second direction X which is perpendicular to the first direction Y, to define the mandrel patterns M. It is worth mentioning that, the pre-mandrel patterns PM are preferably sized up in a fin pattern width in the second direction X, which means that two opposite edges of the pre-mandrel patterns PM are relocated outward along the second direction X in a distance equal to the width of fin pattern 100. For example, if each of the fin patterns 100 has a width of x, the width of each mandrel pattern M may be the width of each pre-mandrel pattern PM (also known as the width of odd number space $S_1$) plus 2x. On the other hand, the pre-mandrel patterns PM are preferably sized up to a predictable length, preferably the predictable length is greater than that of the active area, but not limited thereto.

Through the aforementioned steps, a mandrel array layout having the mandrel patterns M shown in FIG. 4 may be obtained and which can be further outputted to form a photomask (step S5). In this way, the photomask (not shown in the drawings) may have a plurality of photomask patterns related to those mandrel patterns.

It is noted that through defining the width marker having a fixed width in the aforementioned steps of the present invention, the photomask having the mandrel layout related thereto can be easily and conveniently obtained by adjusting the spaces between such width markers. Thus, such photomask obtained thereto can be easily and convenient applied to the fabrication process of the FinFET, for example a double sidewall image transferring (DSIT) process, such that the fabrication process of the FinFET can be effectively improved on the basis of the method of the present invention.

Figure 5:
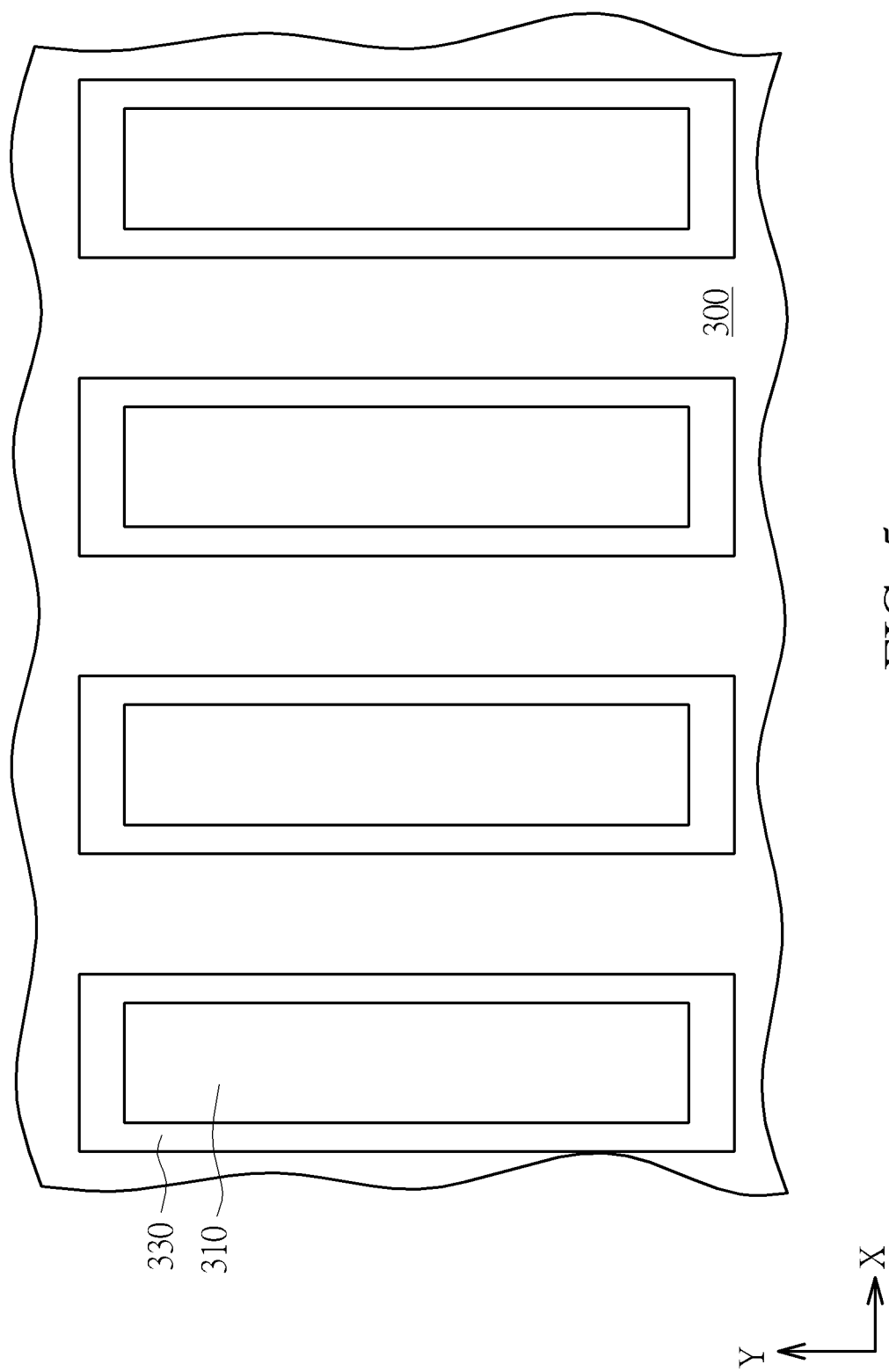
FIG. 5 to FIG. 10 are schematic diagrams illustrating various states of a fabrication process of FinFET according to the photomask of the first preferred embodiment of the present invention.

In the following, a practical example is exemplified to illustrate a fabrication process of fin structure according to the photomask of the aforementioned first preferred embodiment of the present invention. Referring to FIGS. 5-10, FIGS. 5-10 are schematic diagrams illustrating various states of forming a fin structure according to the photomask of the first preferred embodiment of the present invention. First of all, a substrate 300 is provided, and a plurality of mandrels 310 is formed on the substrate 300 through transferring the layout of the aforementioned photomask (not shown in the drawings) to a material layer (not shown in the drawings) on the substrate 300, with each of the mandrels 310 being parallel to and spaced from each other, as shown in FIG. 5. In other words, the mandrels 310 are formed corresponding to the aforementioned mandrel array layout. Then, a plurality of first spacers 330 surrounding each mandrel 310 are formed, respectively. In addition, the material of the mandrels 310 may include polysilicon and the material of the first spacers 330 may include nitride material, or other suitable materials to those skills in the art. However, it is noted that people in the art would easily realize that the present invention is not limited thereto, and the aforementioned fabrication process may be either cooperated or integrated into any conventional semiconductor process by using any suitable materials.

Figure 6:
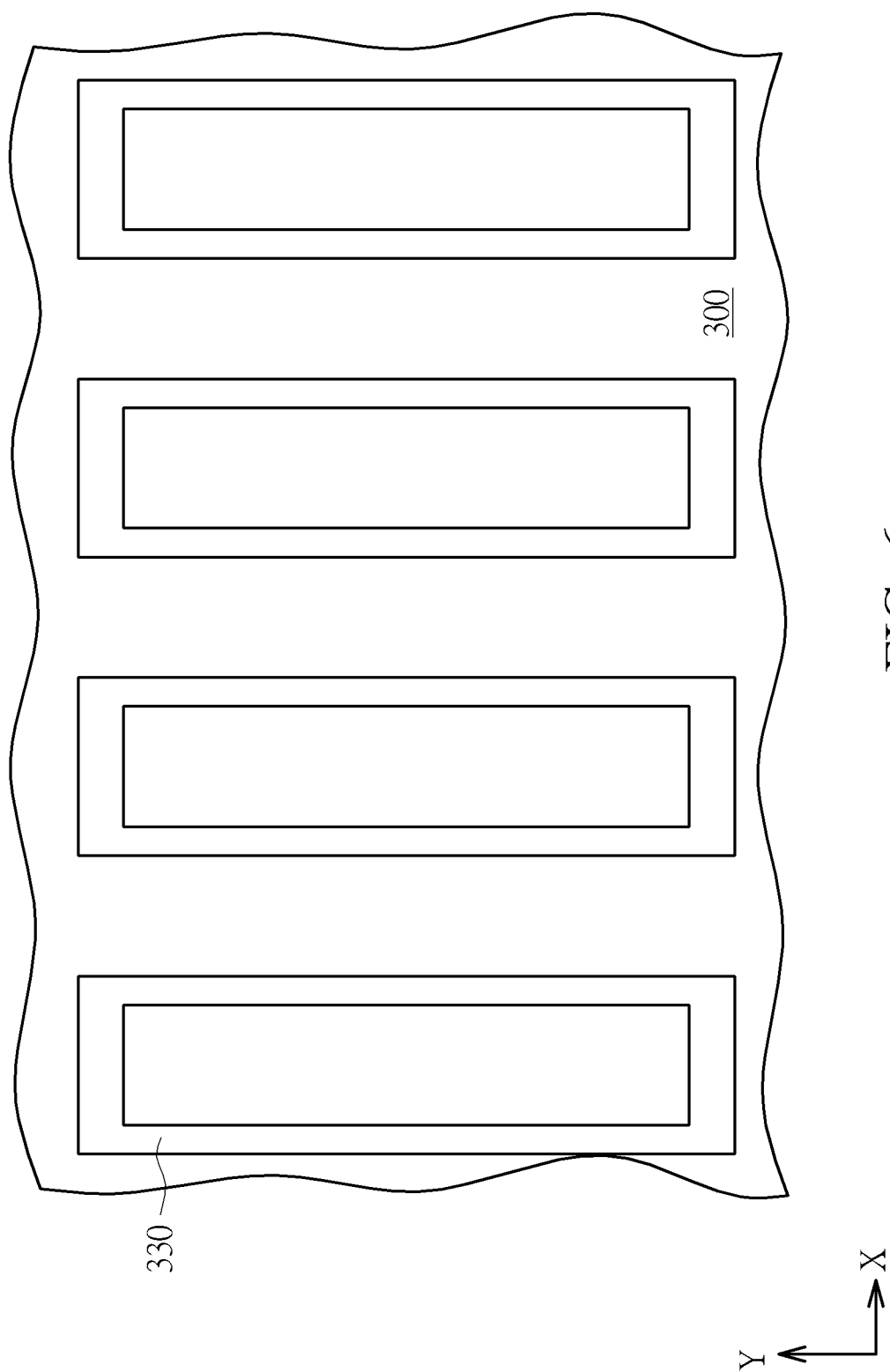
Figure 7:
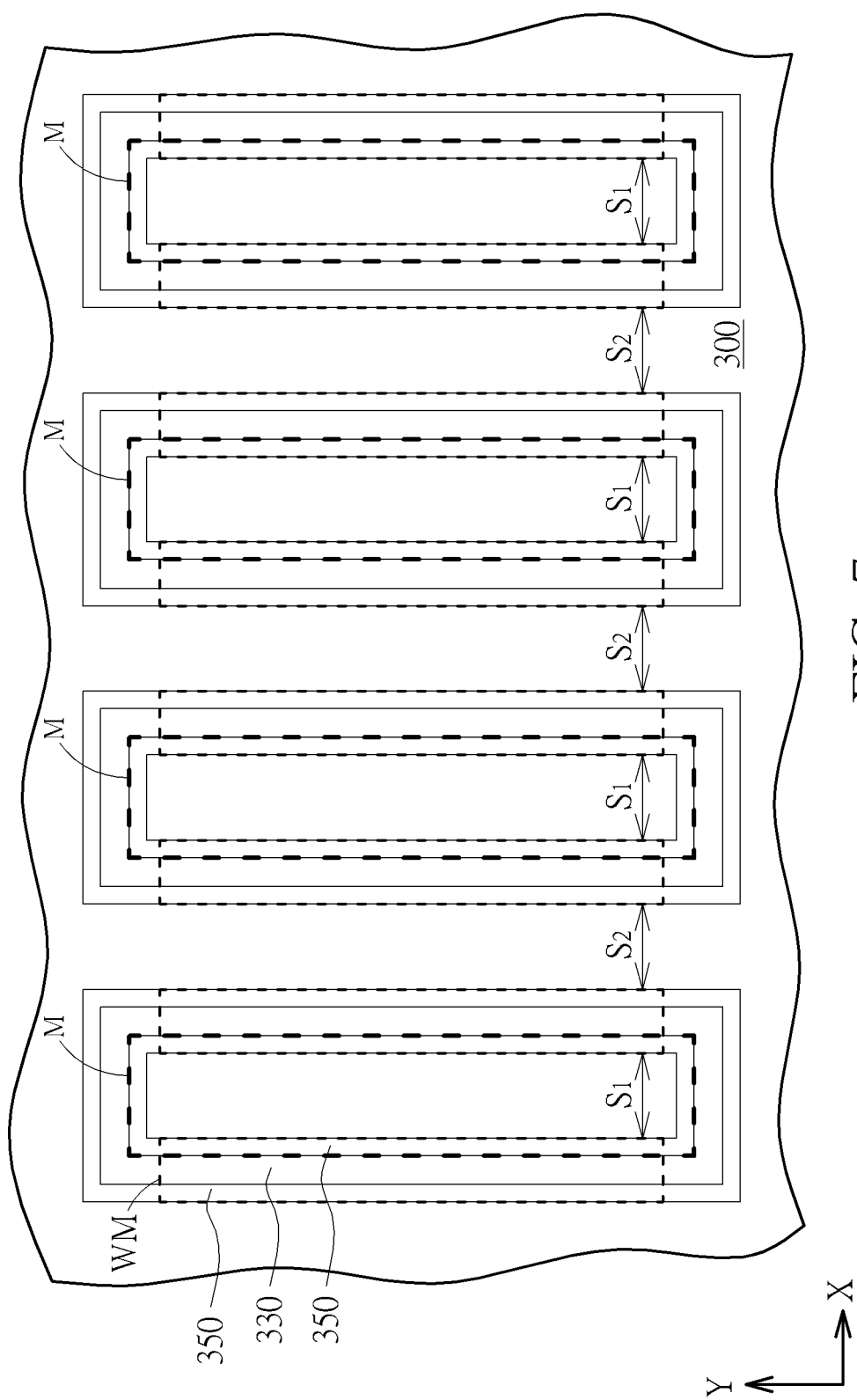

Next, as shown in FIG. 6, the mandrels 310 are removed, so that the closed rectangular frames of the first spacers 330 remain on the substrate 300. Then, as shown in FIG. 7, a plurality of second spacers 350 is formed on the substrate 300, with the second spacers 350 surrounding each first spacer 330, respectively. For example, the second spacers 350 may be formed by firstly forming a spacer material layer entirely (not shown in the drawing) and removing a portion of the spacer material layer to expose a portion of the substrate 300.

It is worth mentioning that, the overall structure of the first spacers 330 and the second spacers 350 form a plurality of closed rectangular frames, and each of the closed rectangular frames surrounds a region which is corresponding to the odd numbered space of the aforementioned mandrel array layout, wherein the region has a width less than the width of the previously removed mandrel 310 (also corresponding to the mandrel patterns M of the aforementioned mandrel array layout) by a fin width size. In other words, the sidewalls of each closed rectangular frame are corresponding to the previously defined width markers WM, and the regions surrounded by each closed rectangular frames and regions between each closed rectangular frames namely refer to the odd numbered spaces (namely $S_1$) and the even numbered spaces (namely $S_2$), respectively. It is also worth mentioning that, those regions (whether the regions surrounded by each closed rectangular frames and the regions between each closed rectangular frames) are all greater than the CD, such that the two second spacers 350 adjacent thereto may not merge with each other.

Figure 8:
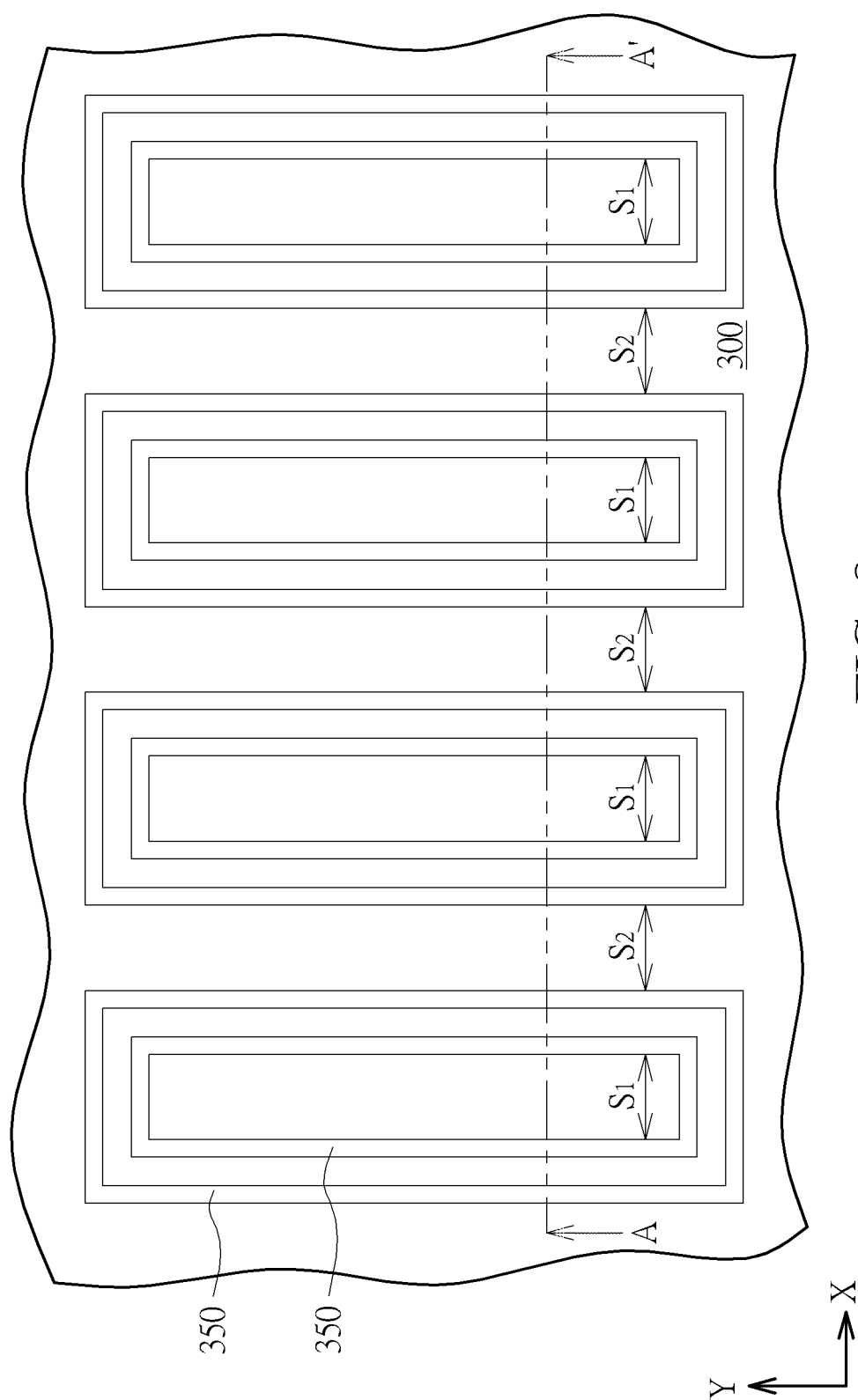
Figure 9:
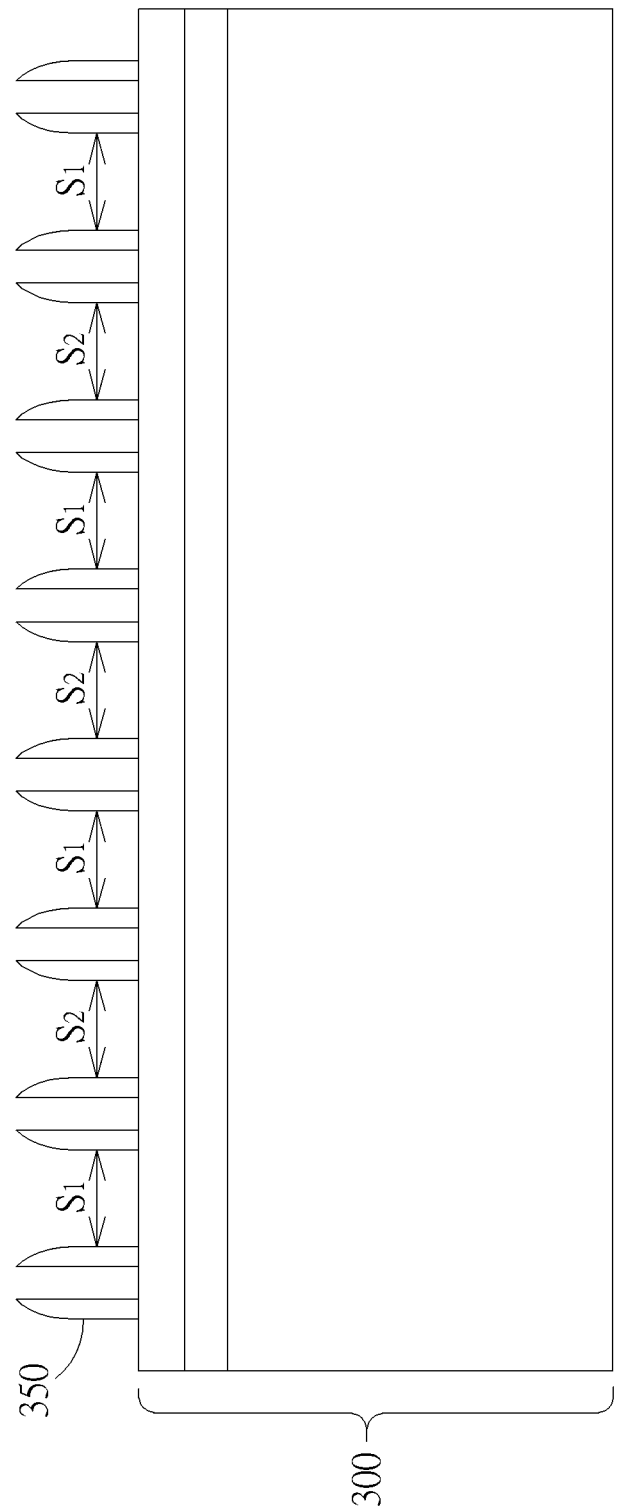

Then, as shown in FIGS. 8-9, wherein FIG. 9 is a schematic cross-sectional view taken along the cross line A-A' in FIG. 8. The first spacers 330 are removed, so that only the closed rectangular frames of the second spacers 350 are remained on the substrate 300. Wherein, each pair of the second spacers 350 is spaced from each other by the spaces of $S_1$ or $S_2$, as shown in FIG. 9, and which is functioned as secondary mandrel to define a fin shaped structure in the following process.

Figure 10:
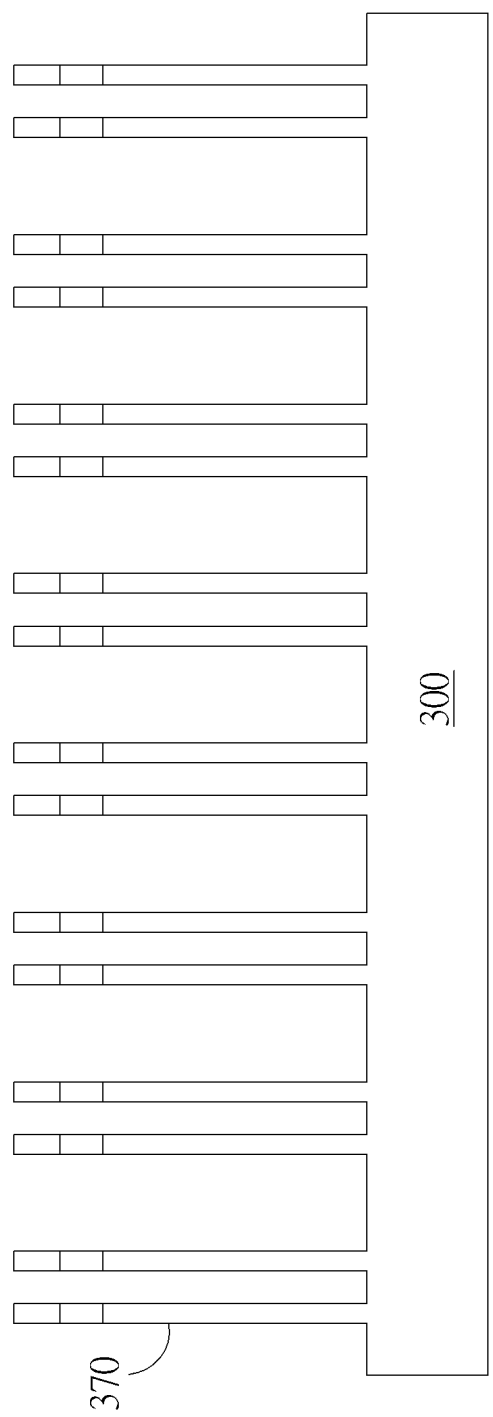

After that, as shown in FIG. 10, the pattern of the second spacers 350 is transferred to the substrate 300, and then the second spacers 350 are removed. Precisely, the patterned of the second spacers 350 is transferred by using the second spacers 350 as the secondary mandrel (also known as an etching mask), to form a plurality of fin-shaped structures 370 in the substrate 300, such that the fin-shaped structures 370 will have the same layout pattern to the second spacers 350. Please note that, since the fin-shaped structures 370 are formed according the photomask, the fin-shaped structures 370 will have the same layout to the predetermined fin array 10 shown in FIG. 1. As following, a fin remove process (not shown in the drawings) may be performed on such fin-shaped structures to remove unnecessary fin structures, such as dummy fins and the connection portion at the two ends of the fins. Please also note that, the aforementioned fabrication process of FinFET is not limited thereto, and those who skill in the art will easily realize that the present method may be either cooperated or integrated into any conventional semiconductor process by using any suitable materials, and which will not be further detail herein.

Figure 11:
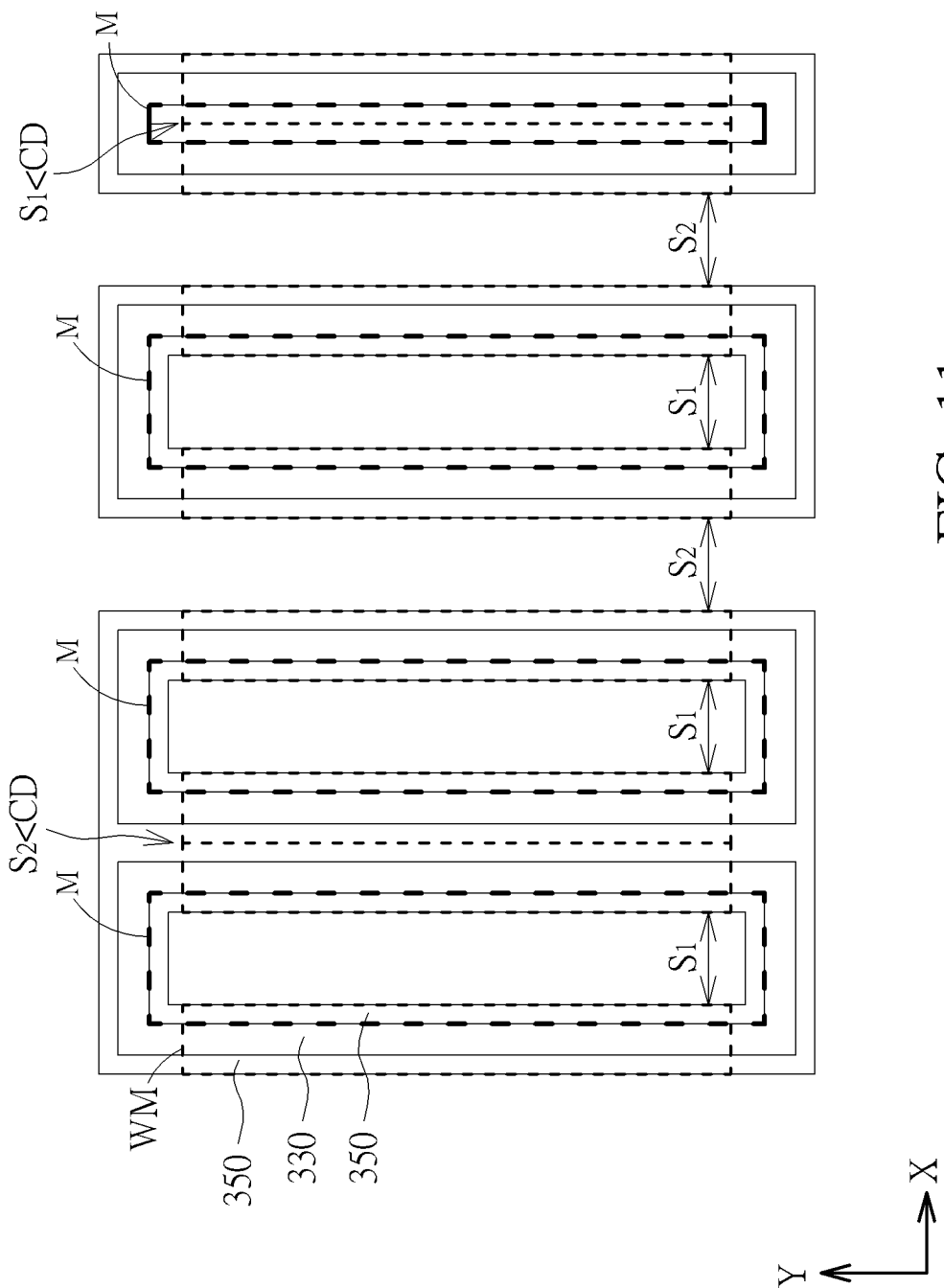
FIG. 11 is a schematic diagram illustrating partial state of a fabrication process of FinFET according to a photomask of a variant embodiment of the first preferred embodiment in the present invention.

Next, referring to FIG. 11, FIG. 11 is a schematic diagram illustrating partial state of a fabrication process of FinFET according to a photomask of a variant embodiment of the first preferred embodiment in the present invention. In comparison with the first preferred embodiment, at least one of the even numbered spaces S is adjusted to have a space $S_2$ less than the aforementioned CD, or at least one of the odd numbered spaces S is adjusted to have a space $S_1$ less than the aforementioned CD after the mandrel patterns M are defined. Accordingly, the two widths markers WM adjacent to the aforementioned even numbered spaces S or the aforementioned odd numbered spaces S may be easy to merge with each other, especially in the following lithography process or etching process. Therefore, while carrying out the following process by transferring the patterns to the substrate 300, at least one fin-shaped structure (not shown in the drawings) having a greater width than others will be formed, accordingly. For example, if the fin-shaped structure generally has a width of x, and the width of such fin-shaped structure may be 2x or more than 2x, but not limited to.

Furthermore, although the aforementioned first preferred embodiment is exemplified by using the regularly arranged fin array formed through a dSIT process, but the present invention is not limited thereto. In other embodiments of the present invention, the predetermined fin array may further include an irregular region (generally referring to other regions of the predetermined fin array outside the regular region) including irregularly arranged fin patterns or fin patterns of variant width. The following description will detail the different embodiments of the method of forming a photomask of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 22:
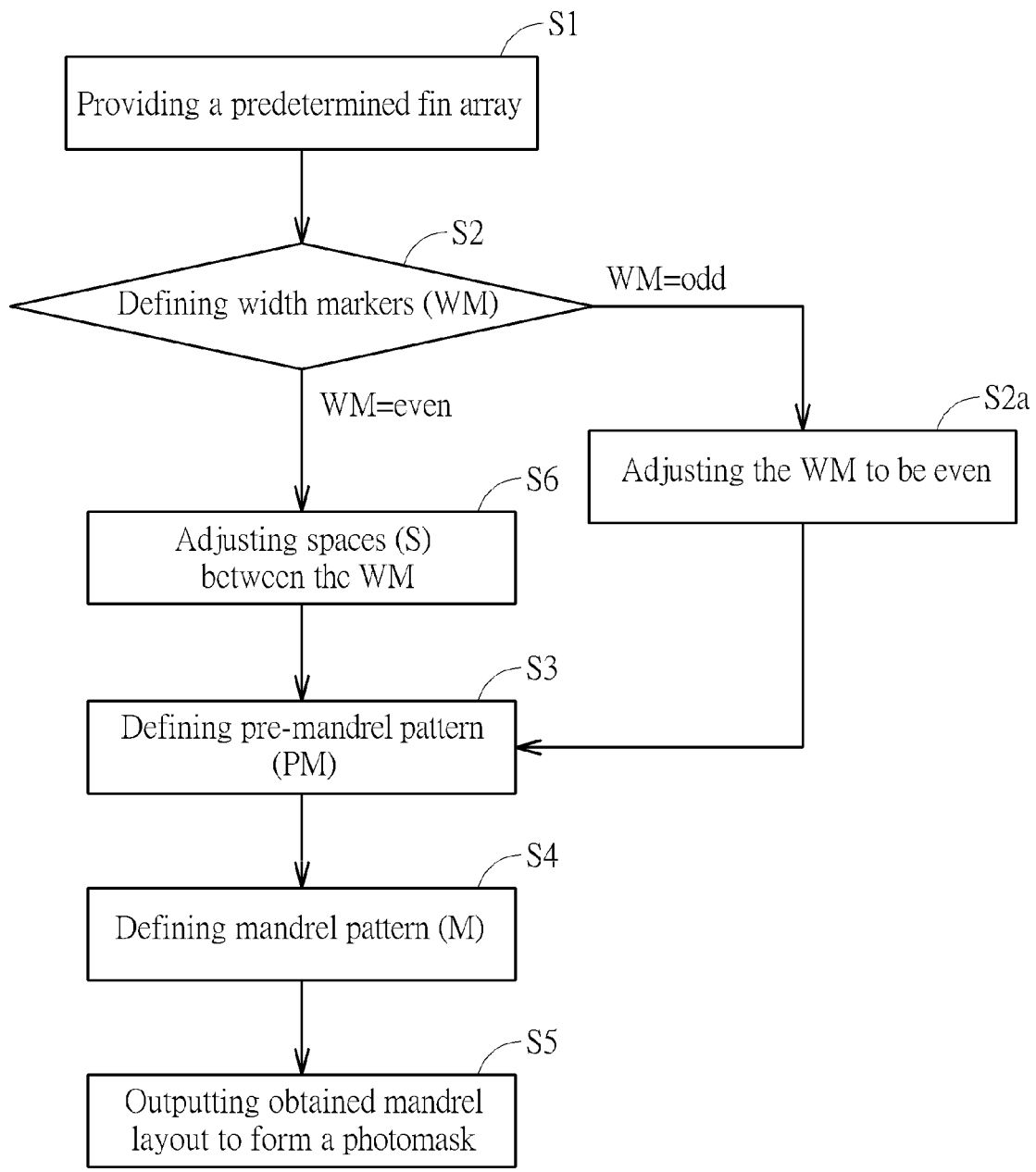
FIG. 22 is a flow chart illustrating a method of forming a photomask according to the second preferred embodiment of the present invention.

Referring to FIG. 22, FIG. 22 is a flow chart illustrating a method of forming a photomask according to a second preferred embodiment of the present invention. In the present embodiment, a predetermined fin array having the irregular region including irregularly arranged fin patterns (not shown in the drawings) is provided. In comparison with the aforementioned first preferred embodiment, the present embodiment further includes adjusting the space of each space S according to the whole predetermined fin array (step S6) after the width markers are defined (step S2). Precisely, the width markers of the present embodiment are firstly defined based on the regular region of the predetermined fin array, to obtain the width marker having a fixed width and spaced from each other via a fixed space. Following this, the spaces, including the odd numbered spaces and the even numbered spaces, may be adjusted in accordance with the practical arrangement of the predetermined fin array. In this way, after the adjusting step, the odd numbered spaces may be different from the evened numbered spaces, one of the odd numbered spaces may have the space different from others, or one of the even numbered spaces may have the space different from others, but not limited thereto. In other words, the spaces of the odd numbered spaces and the even numbered spaces of the present embodiment may be adjustable to have more diverse variation through the adjusting step. Please note that, except for the aforementioned differences, other steps of the method of the present embodiment are all similar to that of the first preferred embodiment, and will not be redundantly described.

Therefore, through the method of the present embodiment, a photomask having the mandrel patterns related to an irregular fin array layout will be obtained easily and conveniently, such that the photomask can also be applied to the DSIT process, to form customized fin array through a simplified process. It means that, the present invention utilizes defining the width marker having a fixed width to predict the features of the mandrel patterns according thereto, so that it is sufficient to obtain more diverse mandrel pattern layout via simply adjusting the arrangement of those width markers. In this way, the fabrication of the photomask related to DSIT process can be convention achieved.

Figure 12:
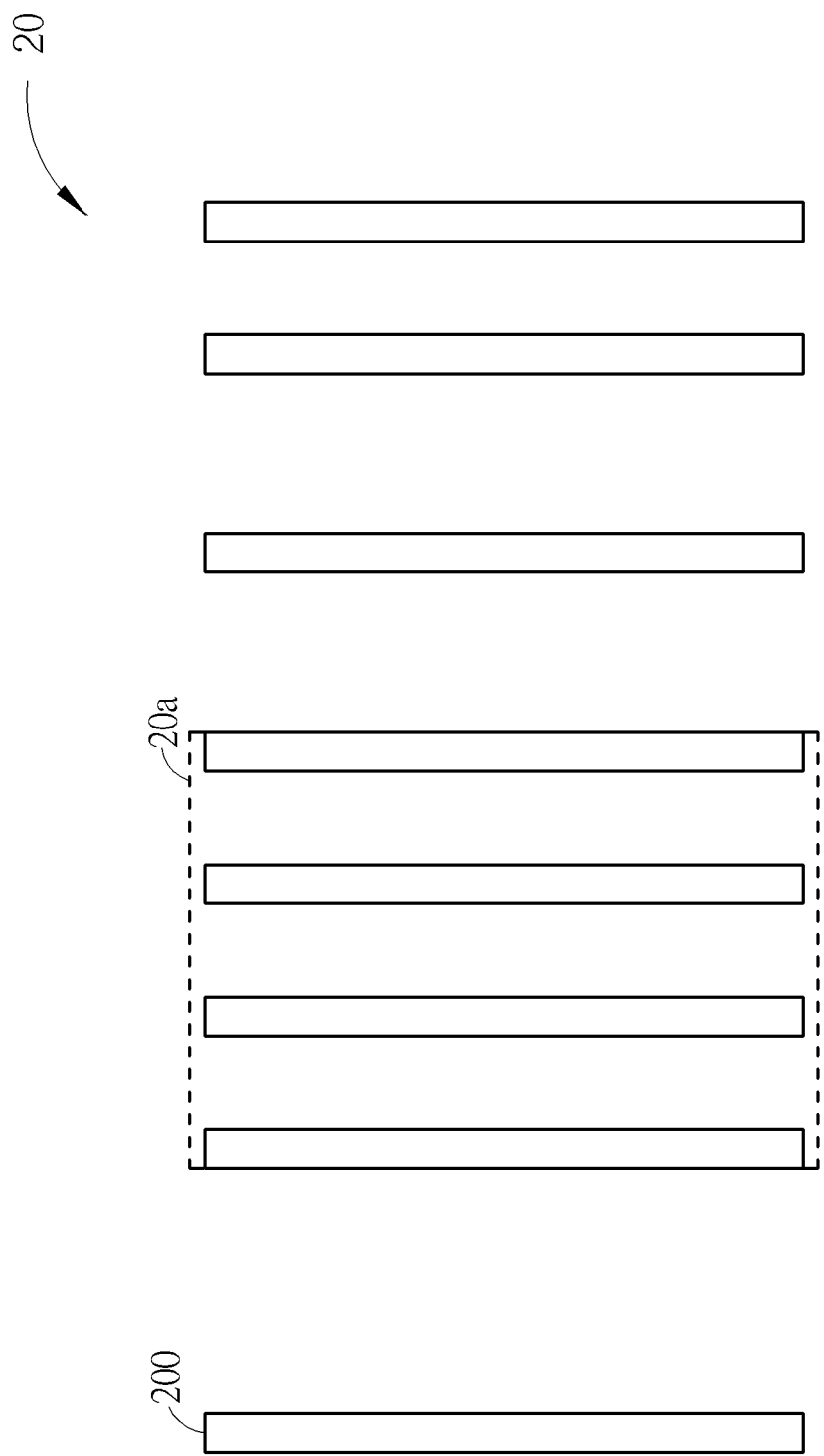
FIG. 12 to FIG. 14 are schematic diagrams illustrating various states in a method of forming a photomask according to a third preferred embodiment in the present invention.
Figure 23:
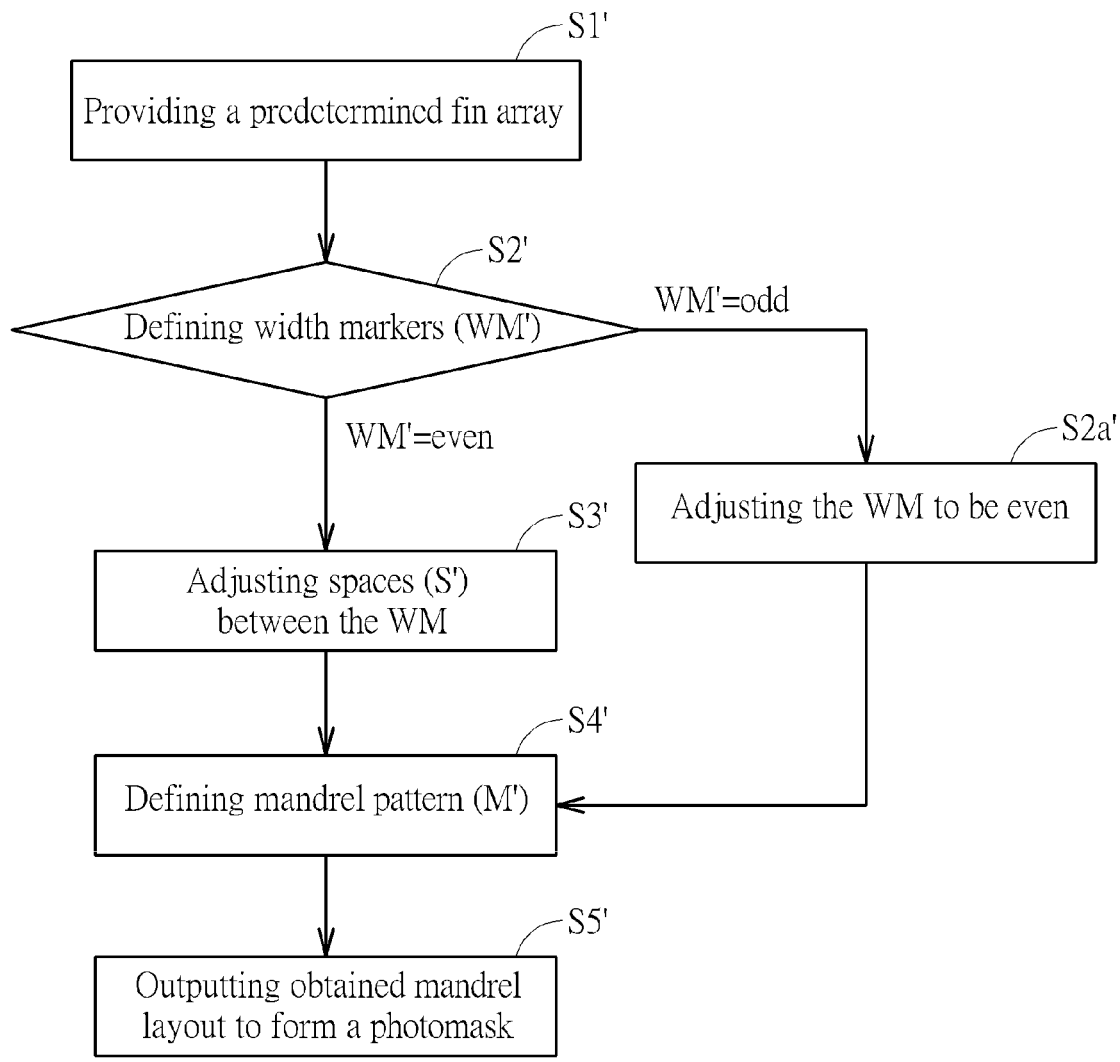
FIG. 23 is a flow chart illustrating a method of forming a photomask according to the third preferred embodiment of the present invention.

As following, referring to FIG. 23, FIG. 23 is a flowchart illustrating a method of forming the photomask according to a third preferred embodiment of the present invention. First of all, as shown in FIGS. 12 and 23, a predetermined fin array 20 is provided to the computer readable medium in the computer system (not shown in the drawings) (step S1'), wherein the predetermined fin array 20 including a plurality of fin patterns 200. It is worth mentioning that the predetermined fin array 20 may also include a regular region 20a having a plurality of regularly arranged fin patterns 200, as shown in FIG. 12 and an irregular region (referring to other region outside the regular region).

Figure 13:
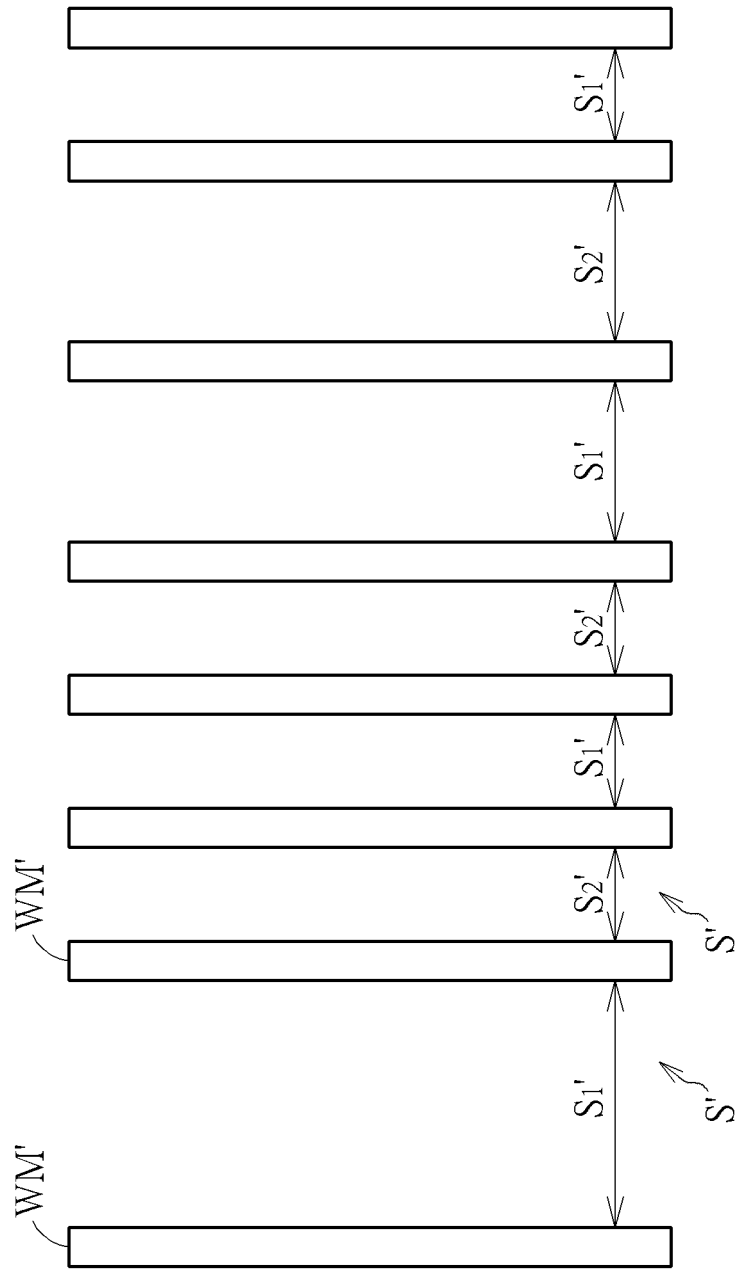

Next, as shown in FIGS. 13 and 23, a plurality of width marker WM' are also defined (step S2') based on the fin patterns 200 in the regular region 20a of the predetermined fin array 20. In comparison with the aforementioned first preferred embodiment, each of the width markers WM' includes only one fin pattern 200 and has a width equal to the fin pattern width. For example, if each fin pattern 200 has a width of x, the width of each width marker WM' may be x either, but the present invention is not limited. Also, each of the width markers WM' is parallel to each other and spaced from each other by a space S'.

Following this, as shown in FIGS. 13 and 23, after the width markers WM' are defined, the spaces of each space S may be further adjusted according to the whole predetermined fin array 200 (including the regular region and the irregular region) (step S3'). Namely, through the present step, the spaces s (namely including $S_1$' and $S_2$') may be adjusted in accordance with practical requirement, so as to present variant arrangements. For example, at least one of the odd numbered spaces S (namely $S_1$') may have a space different from others, or at least one of the even numbered spaces S (namely $S_2$') may have a space different from others. Also, the space of each odd numbered space S (namely $S_1$') may also be different from the space of each even numbered space S (namely $S_2$'), as shown in FIG. 13. However, the present invention is not limited thereto, in another embodiment, the width of the odd numbered space and the even numbered space may remain regular and be the same to each other, or the width marker may also be adjusted according to the practical requirements.

Figure 14:
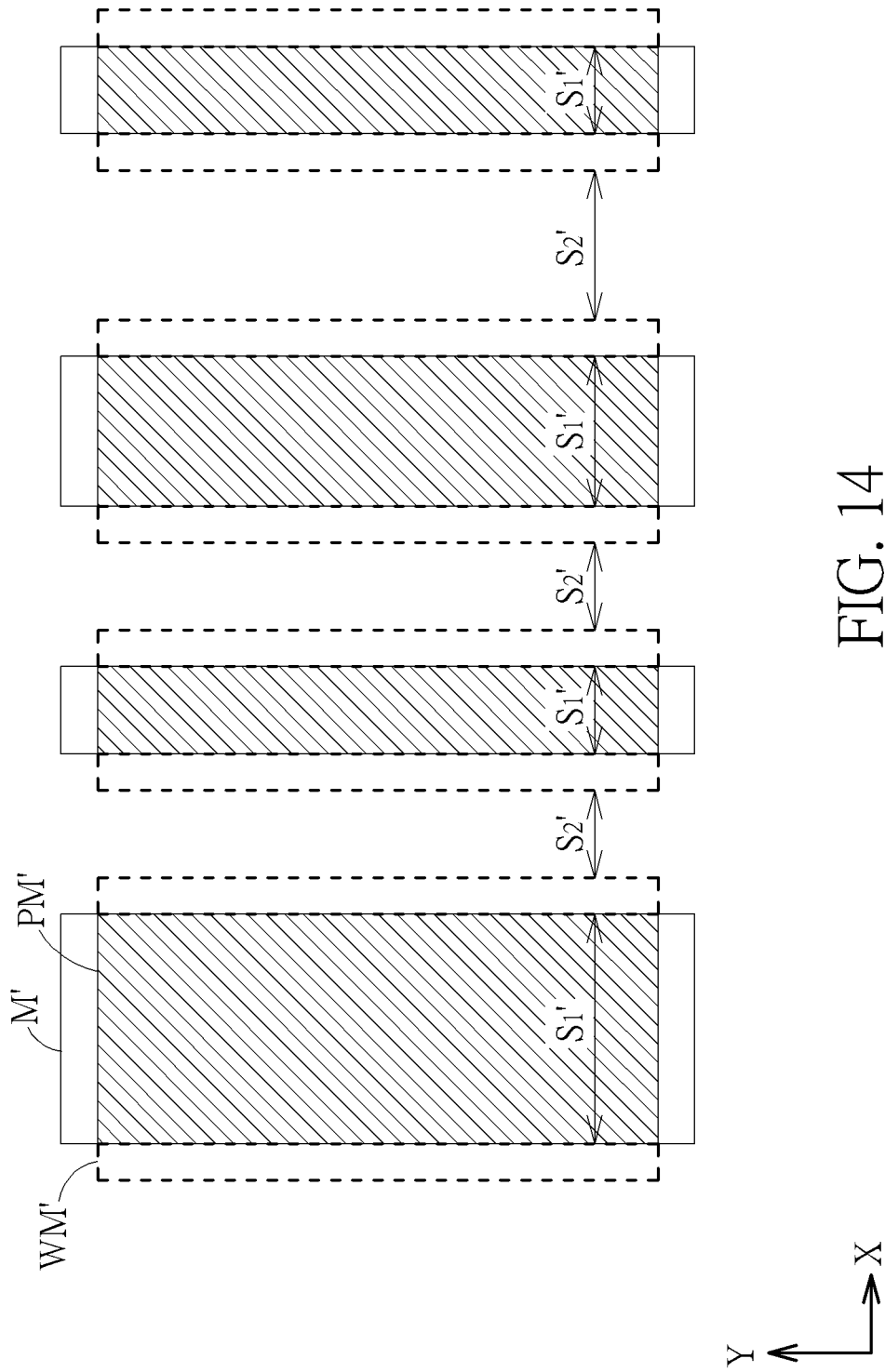

Accordingly, as shown in FIGS. 14 and 23, a plurality of mandrel patterns M' is defined (step S4') on the basis of such variable odd numbered spaces S' through coloring such odd numbered spaces S' and sizing up those odd numbered spaces S' in the first direction Y. Precisely, a plurality of pre-mandrel patterns PM' are firstly defined according to those odd numbered spaces S', and the mandrel patterns M' are sized up preferably to a predictable length in the first direction Y. In one embodiment, the predictable length is substantially greater than a length of the active area, but not limited thereto. Also, in another embodiment, the step of sizing up the pre-mandrel patterns PM' may also be omitted or sized up in other lengths optionally. Besides, except for the aforementioned differences, the features of the method in the present embodiment are all similar to that of the first preferred embodiment and will not be further detail herein.

After that, the mandrel array layout as shown in FIGS. 14 and 23 may be obtain and further outputted to form a photomask (step S5') having a plurality of photomask patterns related to those mandrel patterns M'. It is worth mentioning that, each photomask pattern and the space between the photomask patterns are greater than the aforementioned CD and between a maximum and a minimum respectively, and at least one of the photomask patterns or at least one of the spaces therebetween may be different from other according to the predetermined fin array. Through the aforementioned steps, the width marker having a fixed width is firstly defined, so that the photomask having the mandrel layout related to the customized fin array can be easily and conveniently obtained by adjusting the spaces between such width markers. Then, similar to the first preferred embodiment, the photomask may also be applied to a fabrication process of FinFET, such as a single sidewall image transferring (SSIT) process, to form various fin array layout. In this way, the fabrication process of the FinFET can be effectively simplified and improved, on the basis of the method of the present invention.

Figure 15:
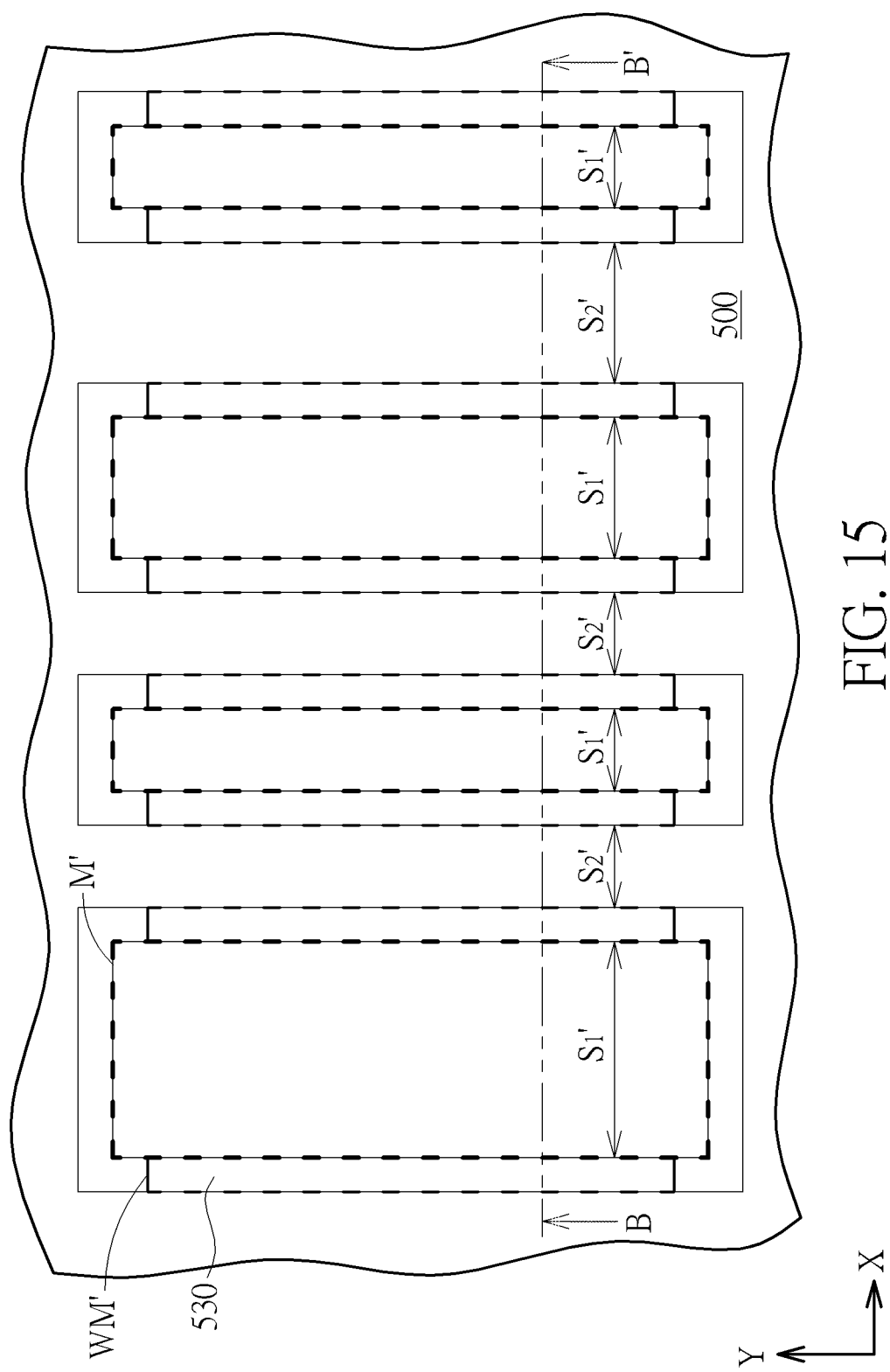
FIG. 15 to FIG. 17 are schematic diagrams illustrating various states of a fabrication process of FinFET according to the photomask of the third preferred embodiment of the present invention.
Figure 16:
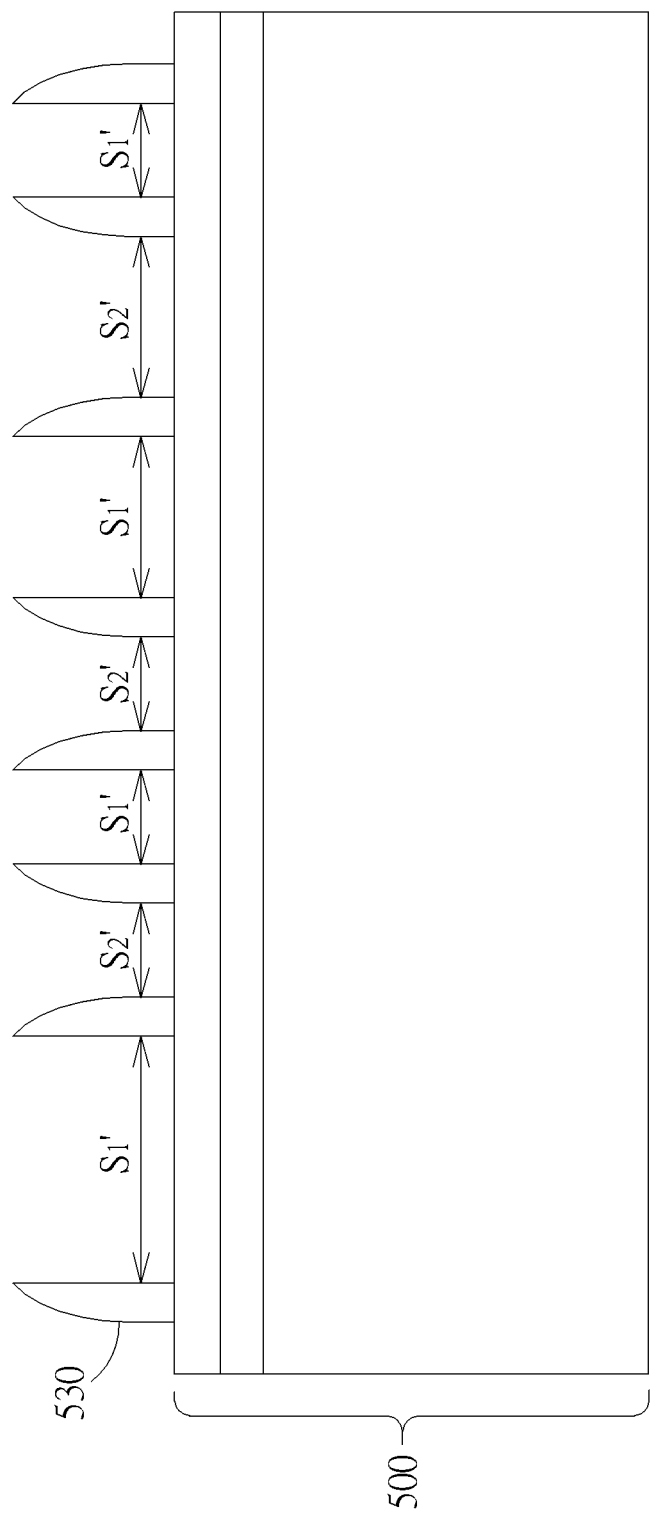
Figure 17:
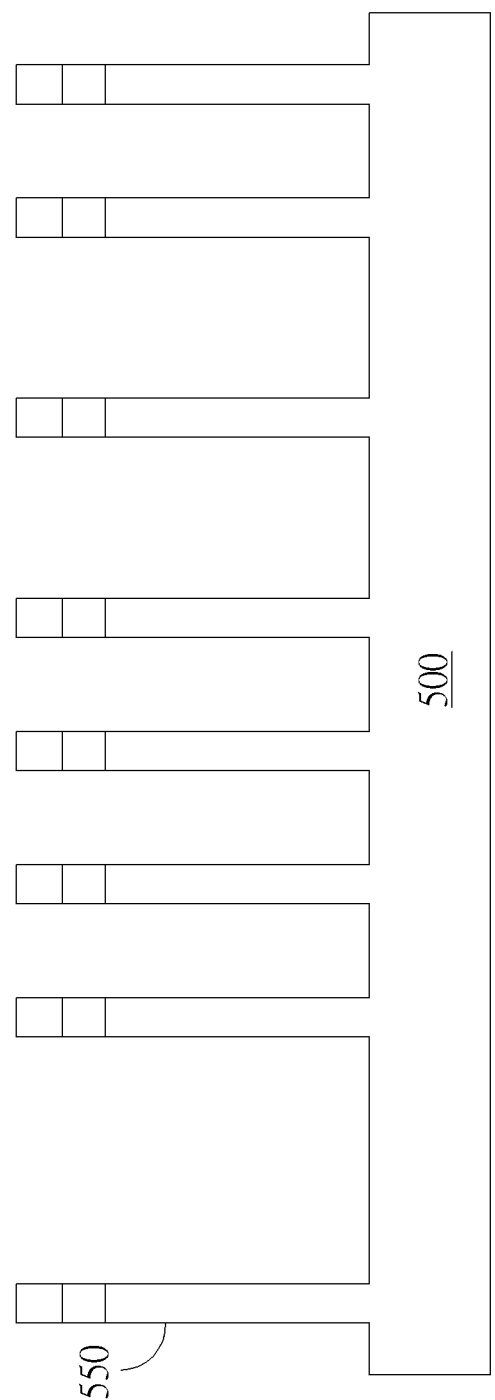

Next, as shown in FIGS. 15-17, FIGS. 15-17 are schematic diagrams illustrating various states of a fabrication process of FinFET according to the photomask of the third preferred embodiment of the present invention. Similar to the aforementioned, a plurality of spacers 530 are formed in closed rectangular frames, respectively. Refer to FIGS. 15-16 firstly, wherein FIG. 16 is a schematic cross-sectional view taken along the cross line B-B' in FIG. 15. The plurality of spacers 530 of the present embodiment may be formed through forming a plurality of mandrels (according to the photomask patterns obtained from the mandrel patterns M' shown in FIG. 14) on a substrate 500, forming the spacers 530 surrounding the mandrels, and removing the mandrels. The material properties of the present embodiment are all similar to that of the first preferred embodiment. However, people in the art would easily realize that the present invention is not limited thereto, and the aforementioned fabrication process may be either cooperated or integrated into any conventional semiconductor process by using any suitable materials.

It is noted that, the closed rectangular frames of the spacers 530 are variable in size because of being formed according to the mandrels invariable size of the aforementioned mandrel array layout. In other words, the sidewall of each closed rectangular frame are corresponding to the previously defined width markers WM, and the spaces surrounded by each closed rectangular frames and spaces between each closed rectangular frame refers to the odd numbered spaces S' having the width of $S_1$' and the even numbered spaces S' having the width of $S_2$', respectively. It is also worth mentioning that, those spaces (whether the spaces surrounded by each closed rectangular frames and spaces between each closed rectangular frames) are all greater than the CD, such that the spacers 530 adjacent thereto may not merge with each other.

Then, as shown in FIG. 17, the pattern of the spacers 530 is transferred to the substrate 500, and then the spacers 530 are removed. Precisely, the patterned of the spacers 530 is transferred by using the spacers 530 as an etching mask, to form a plurality of fin-shaped structures 550 in the substrate 500, such that the fin-shaped structures 550 will have the same layout pattern to the spacers 530. Please note that, since the fin-shaped structures 550 are formed according to the layout of the photomask, at least one of the fin-shaped structures 550 may space from adjacent fin-shaped structure 550 by a different distance. Thus, an accurate layout of fin-shaped structures can be obtained through the present method of the present invention. Please also note that, the aforementioned fabrication process of FinFET is not limited thereto, and those who skill in the art will easily realize that the present method may be either cooperated or integrated into any conventional semiconductor process by using any suitable materials, and which will not be further detail herein.

Figure 18:
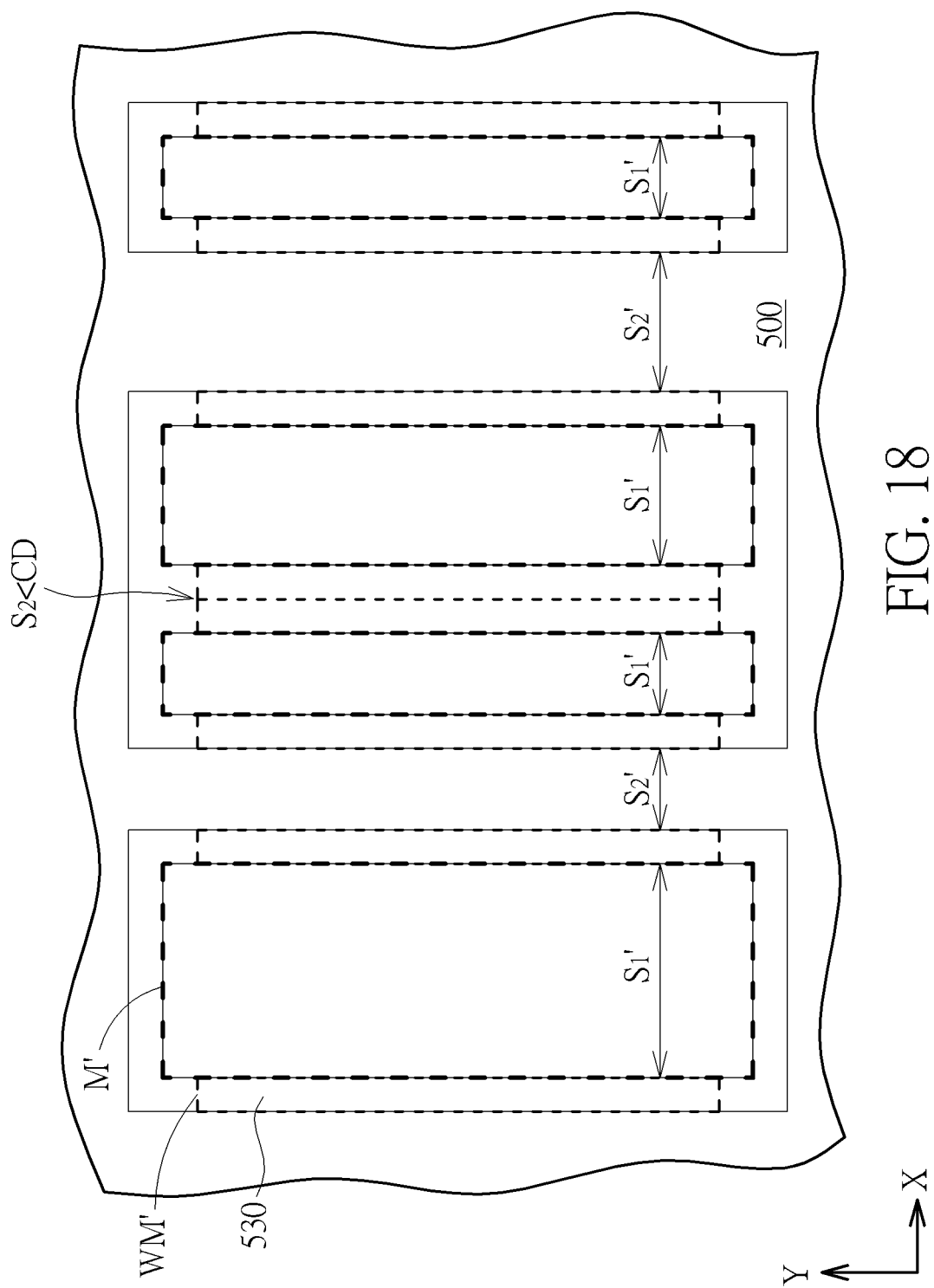
FIG. 18 is a schematic diagram illustrating partial state of a method of forming a photomask according to a variant embodiment of the third preferred embodiment of the present invention.

Referring to FIG. 18, FIG. 18 is a schematic diagram illustrating partial state of a fabrication process of FinFET according to a photomask of a variant embodiment of the third preferred embodiment in the present invention. In comparison with the aforementioned third preferred embodiment, at least one of the even numbered spaces S' is adjusted to have a space $S_2'$ less than the aforementioned CD in the adjusting step (step S3'). Accordingly, the two widths markers WM' adjacent to the aforementioned even numbered spaces S' may be easy to merge with each other, especially in the following lithography process or etching process. Therefore, while carrying out the following process by transferring the patterns to the substrate 500, at least one fin-shaped structure (not shown in the drawings) having a greater width than others will be formed, accordingly. For example, if the fin-shaped structure generally has a width of x, and the width of such fin-shaped structure may substantially be 2x or more than 2x, but not limited to.

Figure 19:
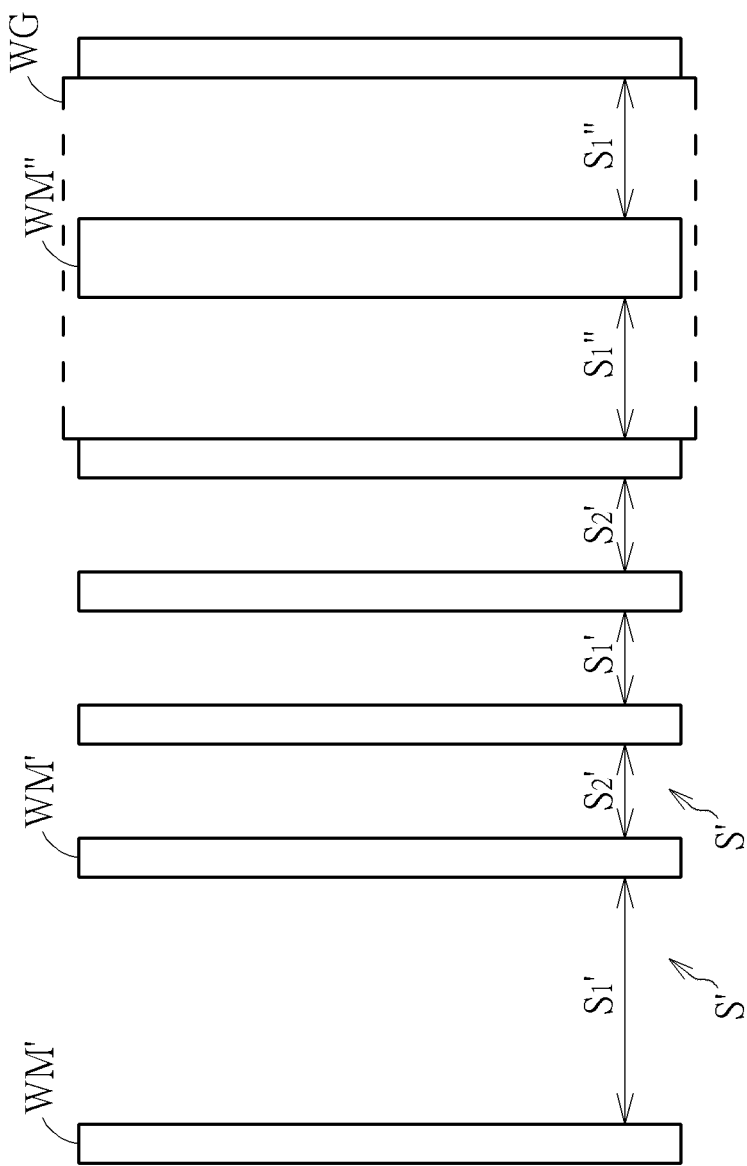
FIGS. 19-20 are schematic diagrams illustrating partial state of a method of forming a photomask according to another variant embodiment of the third preferred embodiment in the present invention.
Figure 20:
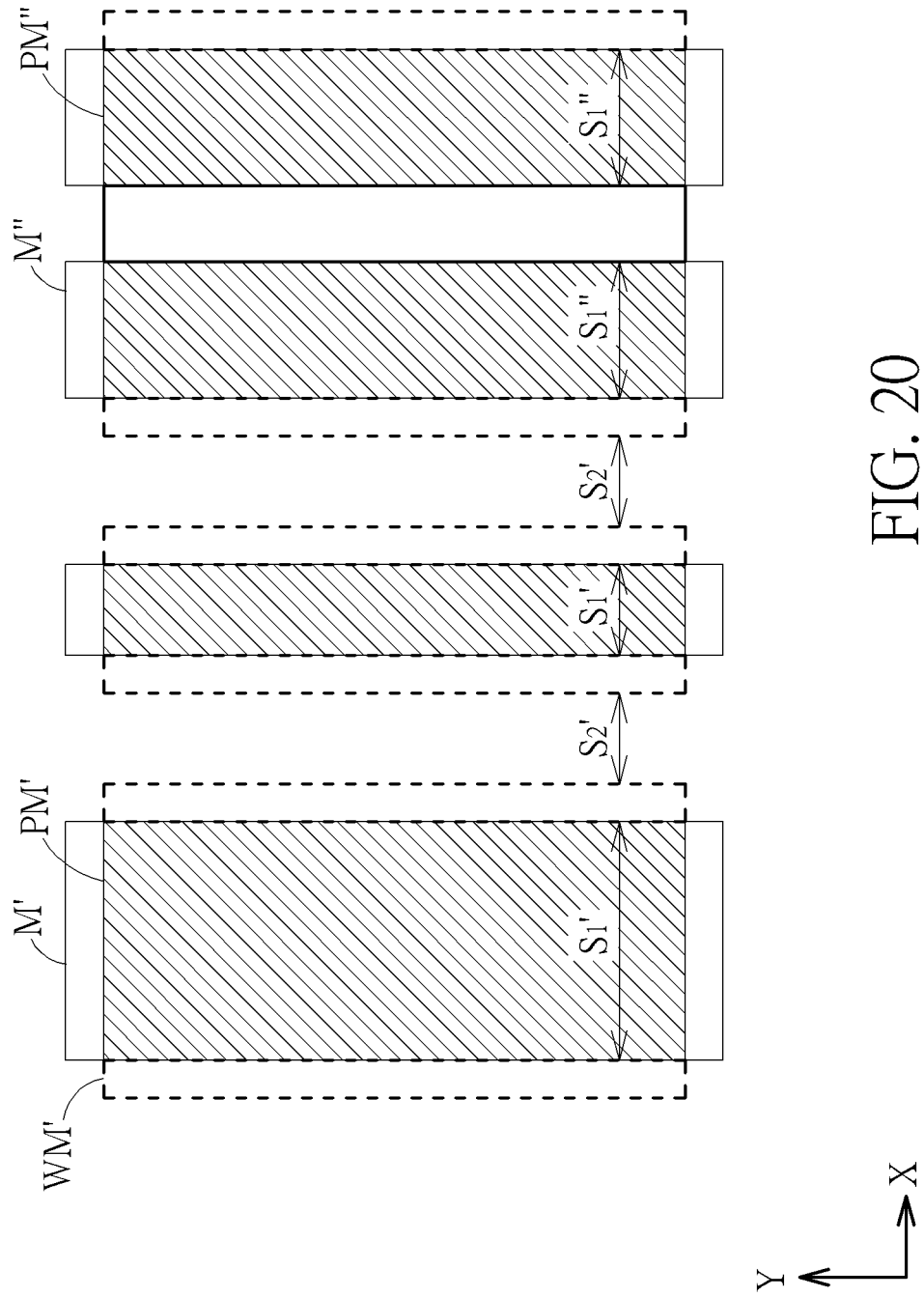

Finally, referring to FIGS. 19-20, FIGS. 19-20 are schematic diagrams illustrating partial state of a method of forming a photomask according to another variant embodiment of the third embodiment of the present invention. In the present embodiment, the predetermined fin array (not shown in the drawings) further includes an irregular region having a fin pattern of greater width, for example, two times greater than other fin patterns, such that, a width marker WM" having a greater width as shown in FIG. 19 may be obtained accordingly, after the step of defining the width markers WM'. Furthermore, please note that, the spaces S" adjacent to the width marker WM" are preferably include a greater space, being at least greater than the minimum of the space S/S' between the width markers WM/WM' (namely, being greater than the CD), but not limited thereto. In one embodiment, the space of the spaces S" adjacent to the width markers WM" further includes a maximum space being greater than the maximum of the space S/S' between the width markers WM/WM'. In comparison with the aforementioned third preferred embodiment, the method of the present embodiment further includes defining a wider group WG, including the greater width marker WM". After that, the spaces $S_1$" at two sides of the greater width marker WM" will be both marked as pre-mandrel patterns PM" in the following step, thereby obtaining mandrel patterns M" having a greater width as shown in FIG. 20.

Therefore, a photomask having at least one greater mandrel pattern is obtained accordingly. In this way, while carrying out the following process by transferring the patterns to a substrate, at least one fin-shaped structure (not shown in the drawings) having a greater width than others will be formed, accordingly. It means that, if the fin-shaped structure generally has a width of x, the width of such fin-shaped structure may substantially be more than x, such as 2x, but not limited to.

In summary, through defining the width marker of a fixed width in the method of forming a photomask of the present invention, the fin widths, as well as the space between fins are easy to be adjusted according to the practical requirement, such that it is easily and convenient to form the photomask having diverse layout, for example having adjustable mandrel width and adjustable space width between mandrels. Thus, such photomask obtained thereto can be easily and convenient applied to the fabrication process of the FinFET, for example a DSIT process or a SSIT process, to form various fin array layout, thereby effectively simplifying the fabrication process of FinFET on the basis of the method of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a photomask, comprising:
   providing a predetermined fin array having a plurality of fin patterns to a computer readable medium in a computer system;
   defining a plurality of width markers by using the computer system, with each of the width markers parallel to each other and comprising two fin patterns, wherein each of the width markers is spaced from each other by a space;
   checking a number of the width markers being an even;
   defining a plurality of pre-mandrel patterns corresponding to odd numbered ones of the spaces;
   defining a plurality of mandrel patterns by sizing up the pre-mandrel patterns; and
   outputting the mandrel patterns to form a photomask.

2. The method of forming a photomask according to claim 1, further comprising adjusting the number of the width markers to even by adding one additional width marker while the number of the width marker is an odd.

3. The method of forming a photomask according to claim 1, wherein the defining of the mandrel patterns comprises:
   sizing up a length of each pre-mandrel pattern to define the mandrel patterns.

4. The method of forming a photomask according to claim 1, wherein the defining of the mandrel patterns comprises:
   sizing up a width of each pre-mandrel pattern to define the mandrel patterns.

5. The method of forming a photomask according to claim 4, wherein the sizing up of the width of the pre-mandrel patterns, two opposite edges of each pre-mandrel pattern are sized up in a distance equal to a width of each fin pattern.

6. The method of forming a photomask according to claim 1, wherein the predetermined fin array further comprises a regular region and an irregular region, and the width markers are defined only corresponding to the fin patterns in the regular region.

7. The method of forming a photomask according to claim 6, wherein after the defining of the mandrel patterns, further comprises:
   adjusting the spaces between the width markers according to spaces in the irregular region of the predetermined fin array.

8. The method of forming a photomask according to claim 1, wherein each odd numbered ones of the spaces has a space $S_1$, and each even numbered ones of the spaces has a space $S_2$, and both of the spaces $S_1$, $S_2$ are greater than a CD.

9. The method of forming a photomask according to claim 8, wherein the space $S_1$ is different from the space $S_2$.

10. The method of forming a photomask according to claim 1, wherein at least one of the odd numbered ones of the spaces is less than a CD.

11. The method of forming a photomask according to claim 1, wherein at least one of the even numbered ones of the spaces is less than a CD.

12. The method of forming a photomask according to claim 1, wherein the photomask comprising a plurality of photomask patterns corresponding to the mandrel patterns.

13. A method of forming a photomask, comprising:

providing a predetermined fin array having a plurality of fin patterns to a computer readable medium in a computer system;

defining a plurality of width markers by using the computer system, with each of the width markers parallel to each other and comprising one fin patterns, wherein each of the width markers is spaced from each other by a space;

checking a number of the width markers being an even;

defining a plurality of mandrel patterns corresponding to odd numbered ones of the spaces; and outputting the mandrel patterns to form a photomask.

14. The method of forming the photomask according to claim 13, further comprising adjusting the number of the width markers to even by adding one additional width marker while the number of the width marker is an odd.

15. The method of forming the photomask according to claim 13, wherein the defining of the mandrel patterns comprises:

defining a plurality of pre-mandrel patterns corresponding to the odd numbered ones of the spaces; and sizing up a length of each pre-mandrel pattern to define the mandrel patterns.

16. The method of forming the photomask according to claim 13, wherein the predetermined fin array further comprises an irregular region having a greater fin pattern, and the method further comprises:

defining a greater width marker corresponding to the greater fin pattern; and defining a wider group to includes the greater width marker.

17. The method of forming the photomask according to claim 16, wherein the defining of the wider group comprising:

defining the spaces at two sides of the greater width marker in the wider group to be mandrel patterns.

18. The method of forming the photomask according to claim 13, wherein the predetermined fin array further comprises a regular region and an irregular region, and the method comprises:

defining the width markers only corresponding to the fin patterns in the regular region; and adjusting the spaces between the width markers according to spaces in the irregular region of the predetermined fin array.

19. The method of forming the photomask according to claim 13, wherein each odd numbered ones of the spaces has a space $S_1$, and each even numbered ones of the spaces has a space $S_2$, and both of the spaces $S_1$, $S_2$ are greater than a CD.

20. The method of forming the photomask according to claim 13, wherein at least one of the odd numbered ones of the spaces is less than a CD, or at least one of the even numbered ones of the spaces is less than a CD.

* * * * *